United States Patent [19]

Kanazawa

[11] Patent Number: 5,779,636
[45] Date of Patent: Jul. 14, 1998

[54] METHOD OF ECHO VOLUME IMAGING AND MRI SYSTEM USING THE SAME

[75] Inventor: Hitoshi Kanazawa, Nasu-Gun, Japan

[73] Assignee: Kabushiki Kaisha Toshiba, Kawasaki, Japan

[21] Appl. No.: 430,361

[22] Filed: Apr. 28, 1995

[30] Foreign Application Priority Data

Dec. 21, 1994 [JP] Japan .................................. 6-318777

[51] Int. Cl.$^6$ .................................................. A61B 5/055
[52] U.S. Cl. ............................................. 600/410; 32/309
[58] Field of Search ..................... 128/653.2; 324/307, 324/309; 600/410

[56] References Cited

U.S. PATENT DOCUMENTS

| | | | |
|---|---|---|---|
| 5,226,418 | 7/1993 | Bernstein et al. | 128/653.3 |
| 5,270,654 | 12/1993 | Feinberg et al. | 324/309 |
| 5,402,787 | 4/1995 | Van Yperen | 128/653.2 |
| 5,422,576 | 6/1995 | Kao et al. | 128/653.2 |
| 5,431,163 | 7/1995 | Kajiyama | 128/653.2 |
| 5,565,777 | 10/1996 | Kanayama et al. | 128/653.2 |

OTHER PUBLICATIONS

Song et al., "Echo–Volume Imaging", *Magnetic Resonance in Medicine*, vol. 32:668–671 (1994).

Kiefer et al., "T2–Weighted Imaging With Long Echo Train 3D–Turbo–Gradient Spin Echo for Neurological Application with High Resolution", *Annual Meeting of the Society of Magnetic Resonance*, No. 780, (1994).

*Primary Examiner*—Brian L. Casler
*Attorney, Agent, or Firm*—Foley & Lardner

[57] ABSTRACT

A method of acquiring MR echo data and MRI system to reconstruct a three or more dimensional image of an object use a "hybrid echo volume imaging (EVI)" technique. In the hybrid EVI, applied to the object at predetermined timings are one RF excitation pulse concurrently with a slice-selective pulse, a readout gradient pulse, and a plurality of RF refocusing pulses. After each of the plurality of RF refocusing pulses, applied to the object is a slice-encoding gradient pulse having a first encoding value changed at every application of each of the RF refocusing pulses. After the slice-encoding gradient pulse, applied are a plurality of further readout magnetic gradient pulses whose polarities are alternately inverted, thereby a plurality of echoes are generated from the object in response to inversion of the polarities. Concurrently with applying the slice-encoding pulse and the plurality of further readout gradient pulses, applied are phase-encoding gradient pulses having a second encoding value changed at every inversion of the polarities. GRASE-specific ringing artifacts are preferably eliminated without degrading an imaging matrix size or spatial resolution and without prolonging imaging time.

29 Claims, 28 Drawing Sheets

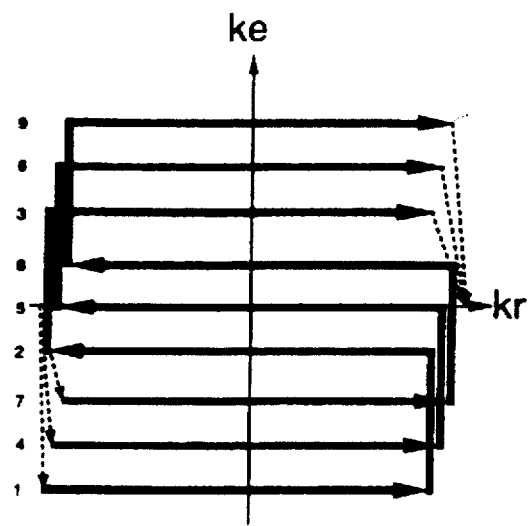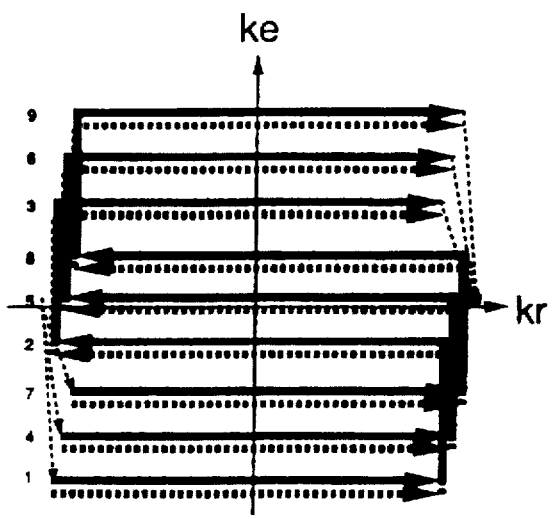
FIG. 2A
PRIOR ART
FIG. 2B
PRIOR ART

2nd SHOT

2nd SHOT

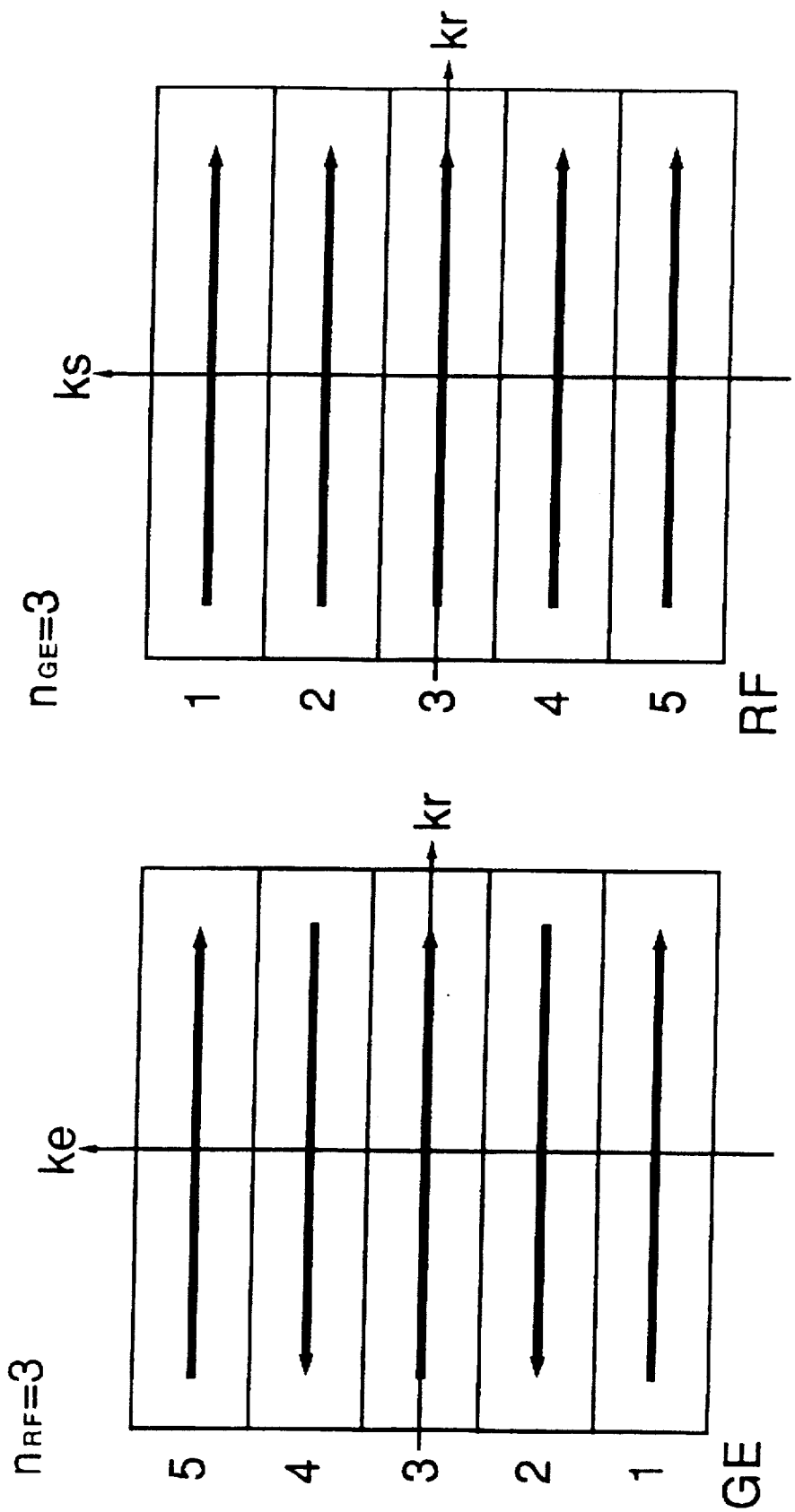

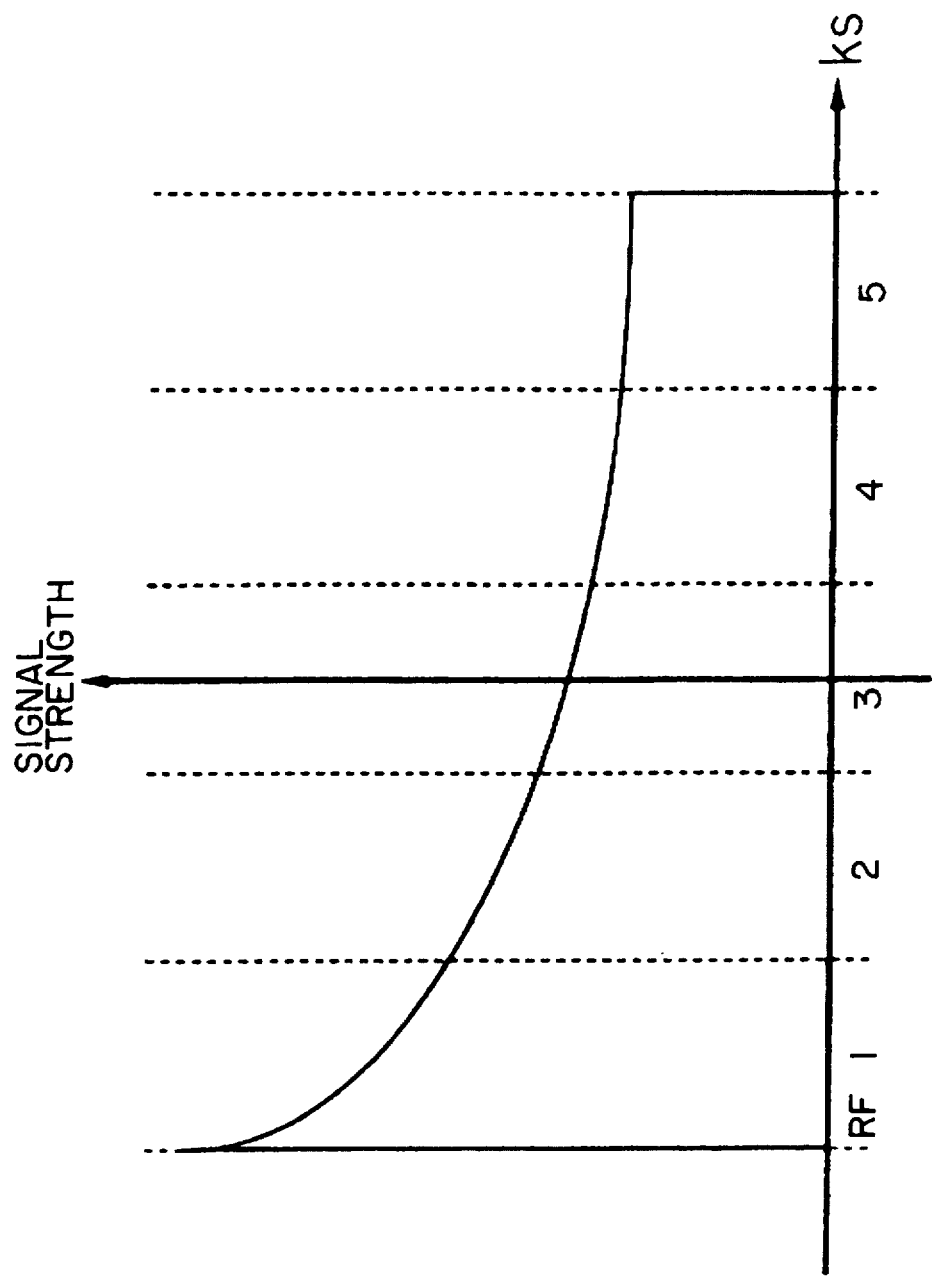

1

METHOD OF ECHO VOLUME IMAGING AND MRI SYSTEM USING THE SAME

BACKGROUND OF THE INVENTION

1. Field of the Invention

The present invention relates to a method of echo volume imaging and a magnetic resonance imaging (MRI) system using the method, in particular, to the method and system suitable to faster three or more dimensional MR imaging.

2. Description of the Related Art

One of the conventional MRI techniques is disclosed, for example, in U.S. Pat. No. 5,270,654 in which a gradient and spin echo (GRASE) technique is known. The GRASE is characterized by the employment of a pulse sequence generated by applying a plurality of 180° radio-frequency (RF) refocusing pulses sequentially after one 90° RF excitation pulse, and applying a pulse of readout magnetic field gradient having a repetitively alternating polarity during an interpulse time after each of the plurality of 180° RF refocusing pulses. Spin-spin magnetization induced by one RF excitation pulse causes a plurality of pulses of readout magnetic field gradient to generate a plurality of echoes. The plurality of echoes are subjected to different phase encoding schemes, whereby echo data is acquired. Thus, GRASE imaging requires shorter imaging time than spin echo imaging to provide contrast images.

As described in the U.S. patent publication, according to the GRASE technique, each echo is phase-encoded differently in order to minimize the encoded-position changes of fat tissue in the direction of phase encoding, the encoded-position change resulting from a chemical shift. Unlike the echo planar imaging (hereinafter EPI) technique, fat suppression pulses (for suppressing echoes originating from fat tissue) need not be applied. GRASE imaging that is achieved without an especially strong magnetic field gradient is enjoying popularity as a fast imaging technique that can be implemented in an ordinary MRI system for clinical application.

A pulse sequence will be described on the assumption that the GRASE technique is adapted to two-dimensional imaging and three-dimensional imaging.

FIG. 1 shows an MRI pulse sequence generated when the GRASE technique is adapted to two-dimensional imaging. FIGS. 2A and 2B show k-space trajectories, along which echo data acquired with the pulse sequence of FIG. 1 is mapped into a k-space. As illustrated, a plurality of gradient echoes are induced by reversing the polarity of a readout magnetic field gradient after each of 180° refocusing RF pulses. Letting $N_{shot}$ denote the number of 90° excitation pulses, $N_{RF}$ denote the number of 180° RF refocusing pulses per shot (excitation cycle), and $N_{GE}$ denotes the number of gradient echoes after respective 180° RF refocusing pulses, phase encoding is achieved so that the $n_{GE}$-th echo data produced with the $n_{RF}$-th 180° RF refocusing pulse during the n-th shot will be mapped into a location in a k-space defined as follows:

$$N_{RF} \times N_{GE}(n_{GE}-1) + N_{RF}(n_{RF}-1) + n$$

Acquired echo data is thus rearranged.

Echo data is placed in association with each shot as shown in FIGS. 2A and 2B. Signal strength changes periodically in a direction ke of phase encoding due to the T2 decay in tissue of a patient. The periodic change in signal strength is manifested as a ringing artifact in a reconstructed image. This drawback is pointed out in the U.S. Pat. No. 5,270,654

2

(line 37 in page 12), thus posing as an underlying problem of the GRASE technique attributable to the principle thereof.

FIG. 3 shows a conventional example of a GRASE pulse sequence adaptable to three-dimensional imaging. A magnetic field gradient oriented in the direction of phase encoding is imposed in the same manner as that for two-dimensional imaging. As for the direction of slice encoding, a magnetic field gradient is imposed during one shot (excitation cycle) so that all echoes will be encoded according to the same quantity of encoding. The quantity of encoding is different from one shot to another.

FIG. 4 schematically shows data mapped into a k-space (spatial frequency space) and produced with the foregoing pulse sequence for three-dimensional imaging. Kr, ke, and ks denote spatial frequencies oriented in directions of readout, phase encoding, and slice encoding respectively. FIG. 5 shows the location of the data $E(n_{GE}, n_{RF})$ representing the $n_{GE}$-th echo generated by the $n_{RF}$-th 180° RF refocusing pulse, which is included in the pulse sequence shown in FIG. 3, in the k-space. As shown in FIG. 5, according to the conventional three-dimensional GRASE technique, the k-space is broadly divided into blocks associated with gradient echoes in the direction ke of phase encoding. Each block is further divided into sub-blocks associated with RF 180° pulses. Thus, the k-space is nested in the direction of phase encoding. There is no allotment to echo data in the direction ks of slice encoding in the k-space.

FIGS. 6A and 6B schematically show echo data produced with the pulse sequence of FIG. 3 and mapped into a k-space during each shot. As illustrated, the value of the location in the direction ks of slice encoding in the k-space is incremented for each shot. The k-space is padded with echo data sequentially. FIGS. 7A and 7B show the changes in signal strength of echo data due to T2 decay. As illustrated, a GRASE-specific periodic change in signal strength is apparent in the direction ke of phase encoding. However, no signal strength change is manifested in the direction ks of slice encoding (an actual change in signal strength stemming from phase encoding is ignored), similarly to three-dimensional imaging with normal SE or FE technique. Consequently, a GRASE-specific ringing artifact appears solely in the direction of phase encoding in a reconstructed MR image.

Several improvements have been proposed in an effort to cope with the foregoing problem. For example, "the proceedings No. 780 of the second meeting of the Society of Magnetic Resonance" has reported an improvement that the effect of signal fluctuation deriving from T2 decay on a three-dimensional image is suppressed by averaging a sum of data produced using twice encoding processes of different encoding orders for each encoding process. "The proceedings No. 27 of the second meeting of the Society of Magnetic Resonance" has reported another improvement that occurrence of ringing artifacts is minimized by setting different flip angles for individual 180° RF refocusing pulses so that resultant echoes will have an equal amplitude.

However, the former improvement for suppressing the occurrence of GRASE-specific ringing artifacts requires addition imaging (averaging). This results in a longer imaging time. The latter improvement poses a problem that image contrast becomes different from that provided by normal spin echo imaging.

Further, prior art disclosing three-dimensional imaging techniques includes by "Echo-Volume Imaging", Allen W. Song et al., Magnetic Resonance in Medicine, vol. 32, PP.668–671 (1994). This imaging material shows singleshot volume imaging by which one 90° RF excitation pulse is followed by a plurality of successive 180° RF refocusing pulses and a readout gradient is alternately inverted in polarity with phase-encoding gradients.

The above "Echo-Volume Imaging" technique, however, has various drawbacks as follows. First, there is no spoiler gradient pulse in the readout direction, being disadvantageous to faster imaging and suppression of FID signals generated by refocusing (RF) pulses. Further, the number of shots (excitation cycles) is limited to one, so that the "Echo-Volume Imaging" is low in usefulness. Slice-selective excitation is carried out for only the 90° RF excitation, not for the 180° RF refocusing, thus it is subjected to noise mixing from the outside of an objected region and/or FID signals generated by refocusing pulses. Furthermore, the "Echo-Volume Imaging" does not describe specific area correspondences between the phase-encoding gradient pulses ygrad and the slice-encoding gradient pulses zgrad. Although this imaging can adopt the same pulse sequence as shown in FIG. 3, ringing artifacts will also arise as described before.

SUMMARY OF THE INVENTION

The present invention attempts to solve the foregoing problems lying in the prior art. A primary object of the present invention is to provide an echo volume imaging technique which suppresses the occurrence of GRASE-specific ringing artifacts without prolonging the imaging time and degrading image quality such as spatial resolution and image contrast.

Another object of the present invention is to, in addition to the primary object, exclude mixing of signals such as noises which are not relevant to echo imaging and increase image quality.

For achieving the above object, in accordance with one aspect of the present invention, a method is disclosed for acquiring MR echo data required to reconstruct a three or more dimensional image of an object, said method comprising the steps of: applying a magnetic RF excitation pulse to the object concurrently with a magnetic slice-selective pulse; after applying the RF excitation pulse, applying a readout magnetic gradient pulse to the object; after applying the readout magnetic gradient pulse, applying a plurality of magnetic RF refocusing pulses to the object; after applying each of the plurality of magnetic RF refocusing pulses, applying to the object a first phase-encoding magnetic gradient pulse having a first encoding value changed at every application of each of the RF refocusing pulses; after applying the first phase-encoding magnetic gradient pulse, applying a plurality of further readout magnetic gradient pulses whose polarities are alternately inverted, thereby a plurality of echoes are generated from the object in response to inversion of the polarities; and concurrently with applying the first phase-encoding magnetic gradient pulse and applying the plurality of further readout magnetic gradient pulses, applying to the object a second phase-encoding magnetic gradient pulse having a second encoding value changed at every inversion of the polarities.

It is preferred that the method further comprises the step of applying a rewinding magnetic gradient pulse to cancel the first encoding value, between applying the first phase-encoding magnetic pulse and applying each of the plurality of magnetic RF refocusing pulses, and/or, the step of applying a rewinding magnetic gradient pulse to cancel the second encoding value, between applying the second phase-encoding magnetic pulse and applying each of the plurality of magnetic RF refocusing pulses.

It is further preferred that the method comprises the step of applying a further magnetic slice-selective pulse to the object concurrently with applying each of the plurality of magnetic RF refocusing pulses.

Preferably, the image is a three dimensional image having three dimensions of a phase-encoding direction, readout direction, and slice-encoding direction. Still preferably, the first phase-encoding magnetic gradient pulse is applied in the slice-encoding direction and the second phase-encoding magnetic gradient pulse is applied in the phase-encoding direction.

In an echo data acquiring method and MRI system in accordance with the present invention, after one RF excitation pulse is applied together a slice selective pulse, a plurality of 180° RF refocusing pulses are applied successively. Concurrently with this, a plurality of echoes are generated by reversing the polarity of a pulse of readout magnetic field gradient continuously during an interpulse time after each of the 180° RF refocusing pulses. This sequence is executed at least once. The sequence includes a step of phase-encoding the plurality of echoes, which are generated by continuously reversing the polarity of a pulse, along a dimension (for example, in a direction of slice encoding) according to a quantity of encoding that differs with every application of the 180° RF refocusing pulse, and a step of phase-encoding the plurality of echoes, which are generated by continuously reversing the polarity of the readout gradient pulse, along a second dimension (for example, in a direction of phase encoding) according to different magnitudes of encoding. Consequently, the direction of mapping echo data produced with the reversal of the polarity of the pulse of readout magnetic field gradient corresponds to a different dimension from the direction of mapping echo data produced with the application of the 180° RF refocusing pulse. The periodicity in signal strength of echo data mapped in the direction of phase encoding is eliminated substantially.

BRIEF DESCRIPTION OF THE DRAWINGS

In the drawings:

FIG. 2A schematically shows acquiring and mapping of data performed during the first shot of the conventional GRASE imaging;

FIG. 2B schematically shows acquiring and mapping of data performed during the second shot of the conventional GRASE imaging;

FIG. 13A schematically shows the direction of mapping data produced with the third 180° RF pulse $RF_3$ ($n_{RF}=3$) onto the ke-kr section;

FIG. 13B schematically shows the direction of mapping data produced with the third magnetic field gradient $GE_3$ ($n_{GE}3$) onto a ks-kr section;

FIG. 14B is a graph plotted to indicate a change in signal strength in a direction ks;

DETAILED DESCRIPTION OF THE PREFERRED EMBODIMENTS

Referring to FIGS. 8 to 14, an embodiment of the present invention will be described.

Figure 8:
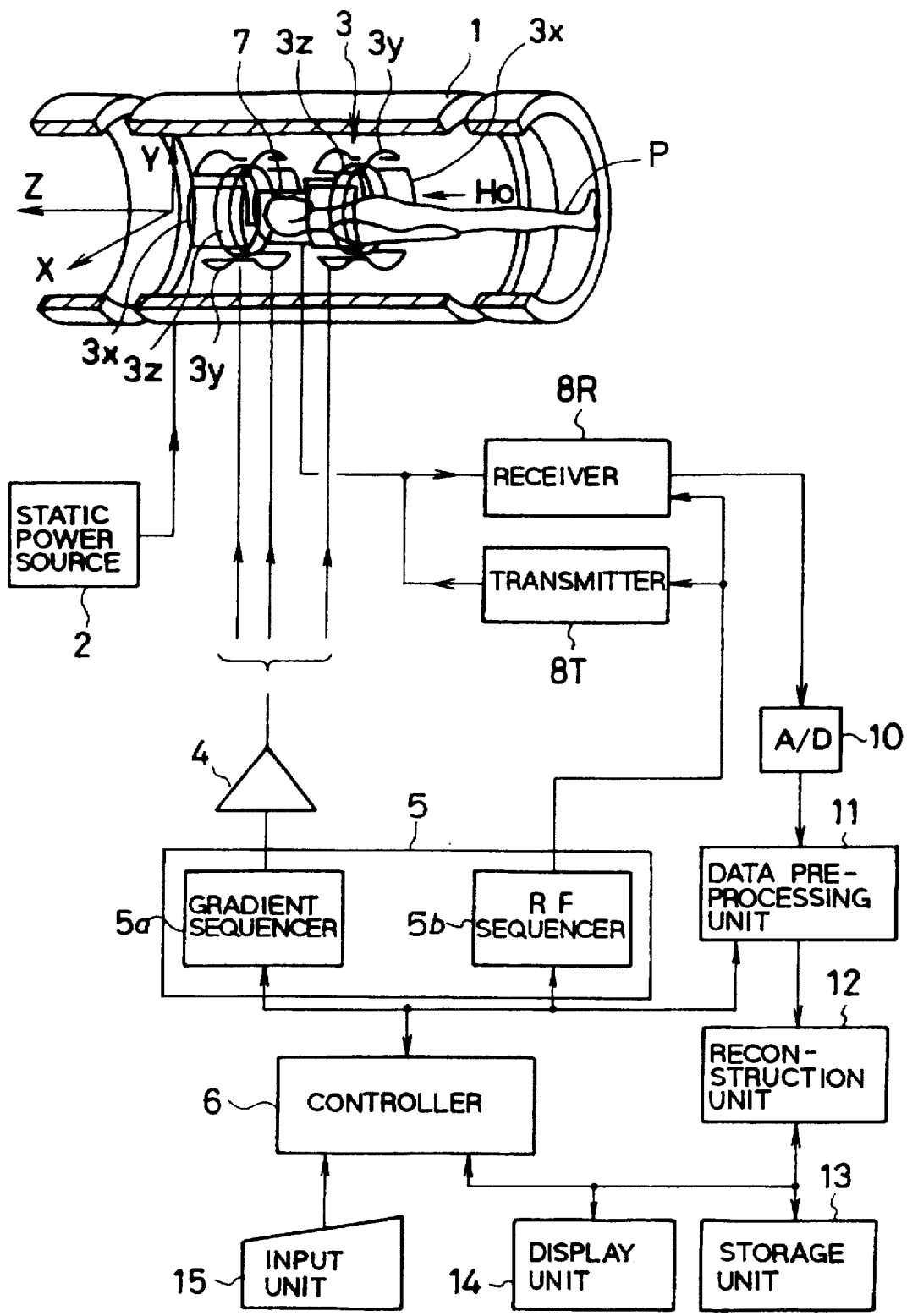
FIG. 8 is a block diagram showing an MRI system of an embodiment of the present invention.

FIG. 8 shows the outline configuration of an MRI system in accordance with an embodiment. The MRI system comprises a magnet section for generating a static magnetic field, magnetic field gradient section for providing location information relative to the static magnetic field, a transmitter/receiver section responsible for selective excitation and reception of MR signals, and a control arithmetic section responsible for system control and image reconstruction.

The magnet section includes a magnet 1 which, for example, consists of a superconducting one and a static power source 2 for supplying current to the magnet 1. The magnet 1 generates a static magnetic field $H_0$ in a z-axis direction of its cylindrical diagnostic space into which a patient P or a subject to be imaged is inserted. Three x-, y-, and z-axes are virtually assigned to the space so that the z-axis is coincident with the axial direction of the space.

Figure 9A:
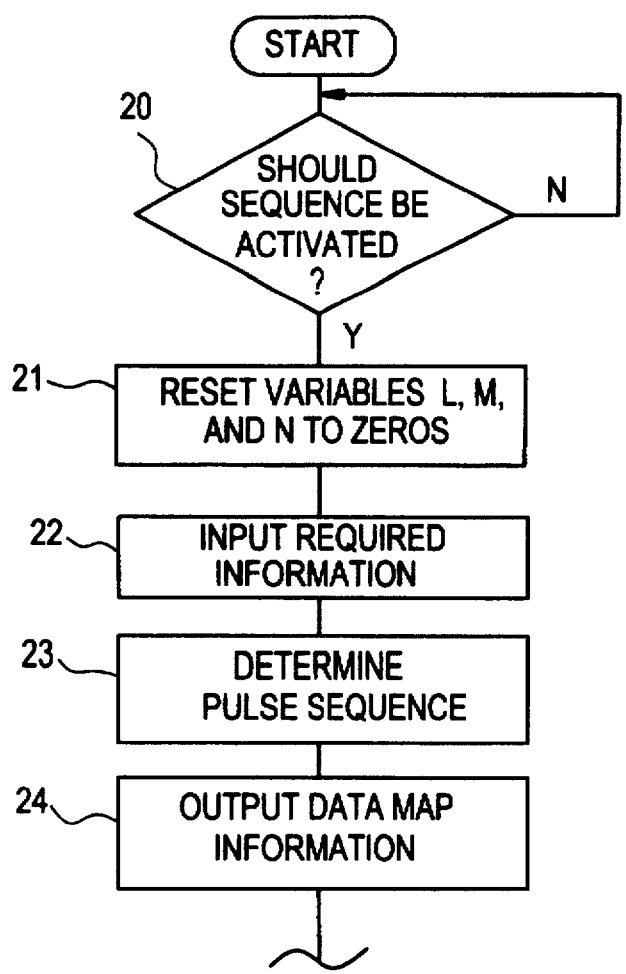
FIGS. 9A and 9B is a flowchart describing a sequence effected by a sequencer in the embodiment.
Figure 9B:
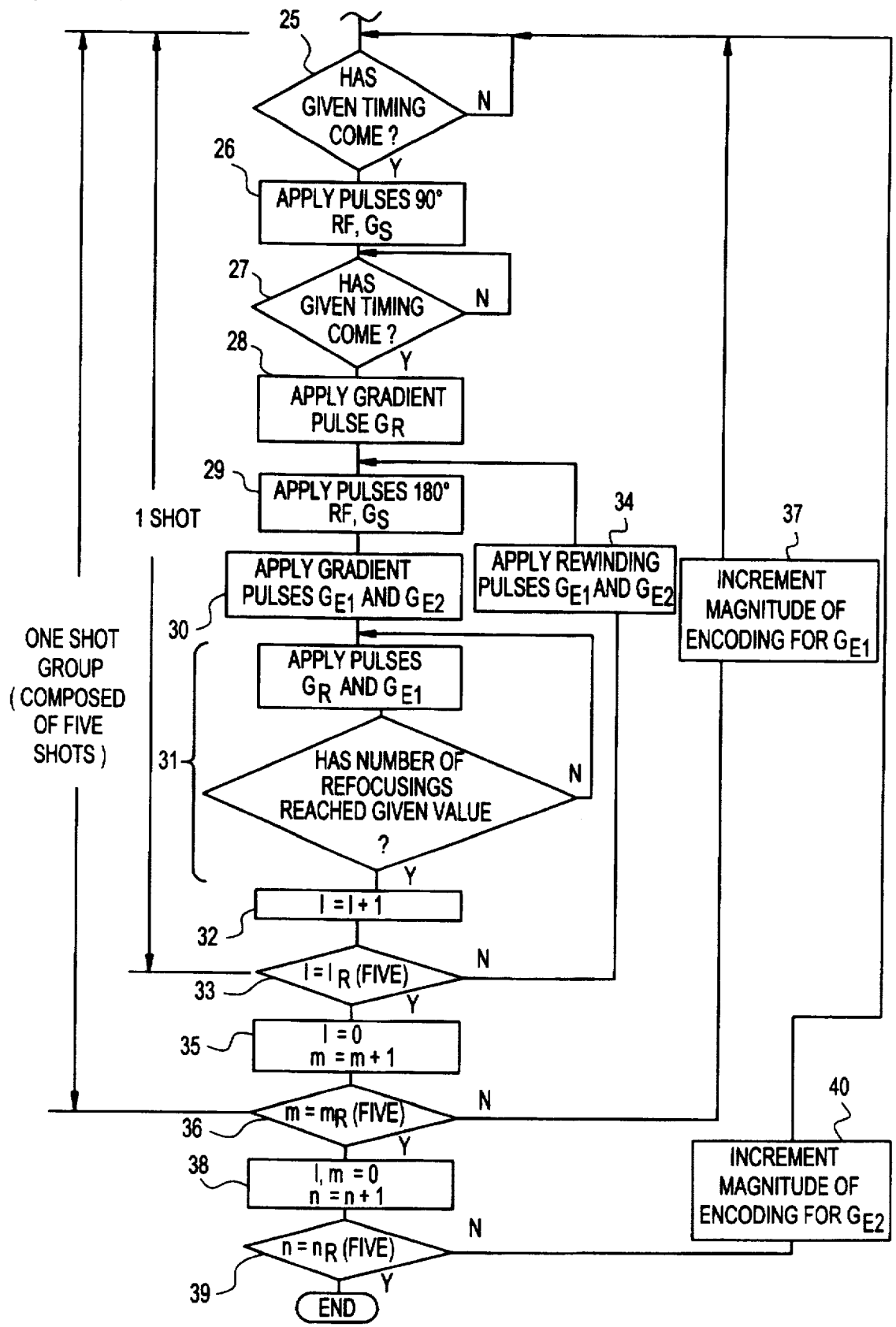

The magnetic field gradient section includes three gradient coils 3x to 3z incorporated along x, y, and z axes of the magnet 1, a gradient power source 4 for supplying current to the gradient coils 3x to 3z, and a gradient sequencer 5a lying in a sequencer 5 so as to control the power supply 4. The gradient sequencer 5a includes a computer. In response to a signal sent from a controller 6 (having a computer) for controlling the entire system, the gradient sequencer 5a executes an acquisition sequence based on an improved imaging in accordance with the present invention (hereinafter, referred to as "hybrid echo volume imaging (EVI)"), which is shown in FIGS. 9A and 9B. According to the sequence, the gradient sequencer 5a controls the applications of the magnetic field gradients oriented along the x-, y-, and z-axes so that the magnetic field gradients will be convoluted to the static magnetic field $H_0$. In this embodiment, the magnetic field gradient oriented along the z-axis among the three mutually-orthogonal axes is regarded as a slicing magnetic field gradient $G_S$. The magnetic field gradient oriented along the x-axis thereof is regarded as a readout magnetic field gradient $G_R$. The magnetic field gradient oriented along the y-axis thereof is regarded as a phase encoding magnetic field gradient $G_{E1}$. Still, a slice-encoding magnetic field gradient $G_{E2}$ is applied along the z-axis thereof.

The transmitter/receiver section includes an RF coil 7 to be placed in the vicinity of the patient P in the imaging space inside the magnet 1, a transmitter 8T and receiver 8R to be linked to the RF coil 7, and an RF sequencer 5b (having a computer) incorporated in the sequencer 5 and designed to control the timing of actuating the transmitter 8T and receiver 8R. The RF sequencer 5b receives an output command from the gradient sequencer 5a and commands the application of an RF pulse synchronously with the gradient sequencer 5a. The transmitter 8T and receiver 8R operate under the control of the RF sequencer 5b so as to supply RF pulses at the Larmor frequency at which resonance phenomenon occurs and perform various signal processing schemes on MR (RF) signals received by the RF coil 7, thus forming echoes.

The control arithmetic unit includes not only the controller 6 but also an A/D converter 10 for converting an echo formed by the receiver 8R into digital data, and a data preprocessing unit 11 for receiving the digital data and mapping it into a k-space. A reconstruction unit 12 for performing image reconstruction using three-dimensional Fourier transform, a storage unit 13 for storing reconstructed image data, a display unit 14 for displaying images, and an input unit 15 are installed in the output stage of the data preprocessing unit 11. The controller 6 has, as mentioned above, a computer and controls the actions of the entire system and the timing of actuating the components.

Next, the operation of this embodiment will be described.

When the MRI system is activated, the sequencer 5 starts executing the sequence shown in FIGS. 9A and 9B.

Figure 10:
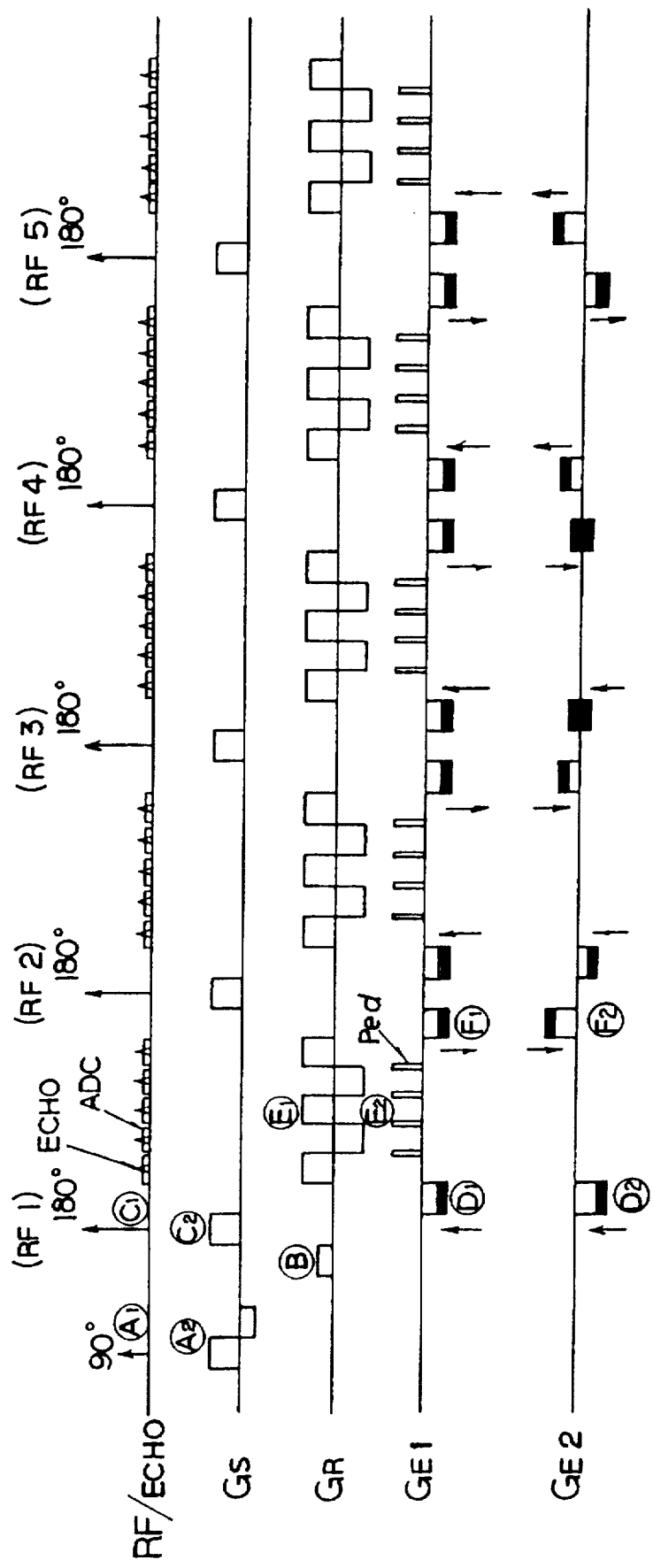
FIG. 10 shows a pulse sequence provided by hybrid EVI in the embodiment.

Initially, the sequencer 5 is on standby while determining whether a pulse sequence shown in FIG. 10 for use in three-dimensional imaging based on the improved GRASE, that is, the hybrid EVI, has been sent from the controller 6. When an examining physician uses the input unit 15 to enter an imaging start command, the sequencer 5 determines at step 20 that a pulse sequence has been sent from the controller 6 (the sequencer should operate), and processes the subsequent steps.

Figure 1:
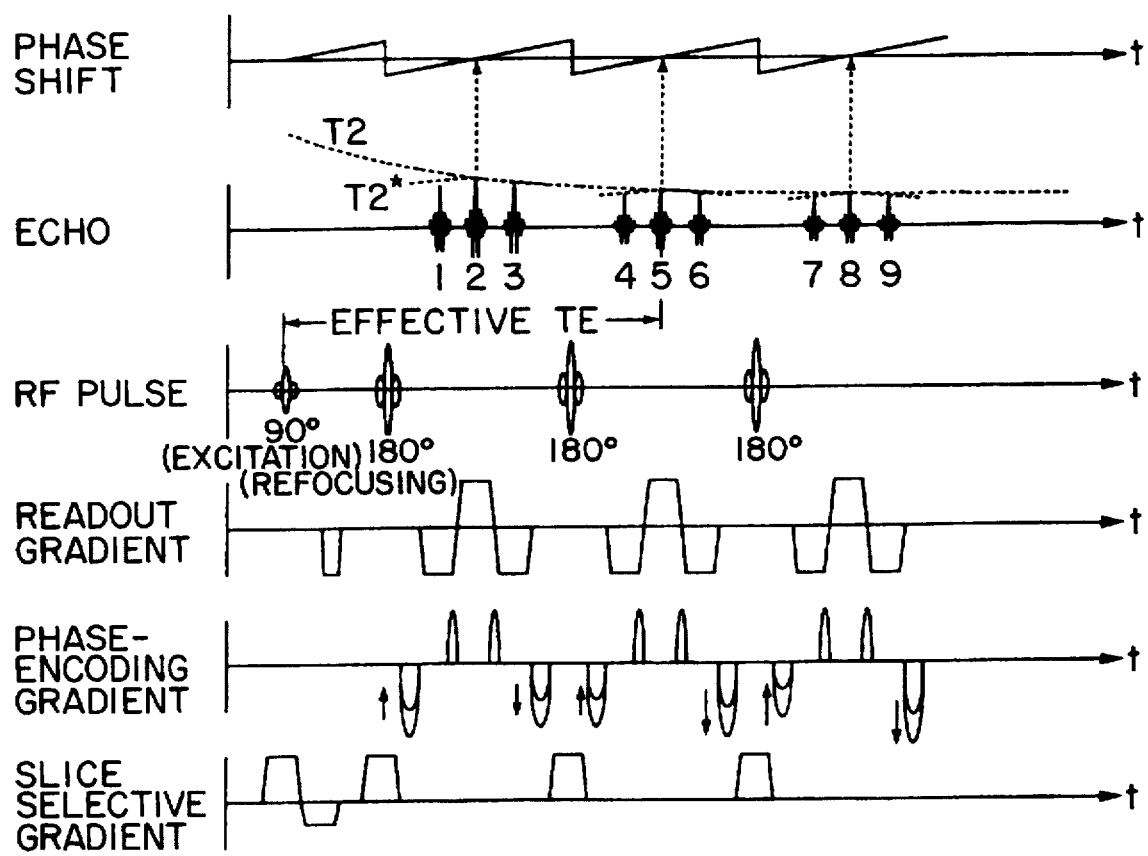
FIG. 1 shows a pulse sequence for use in two-dimensional imaging based on a conventional GRASE technique.
Figure 3:
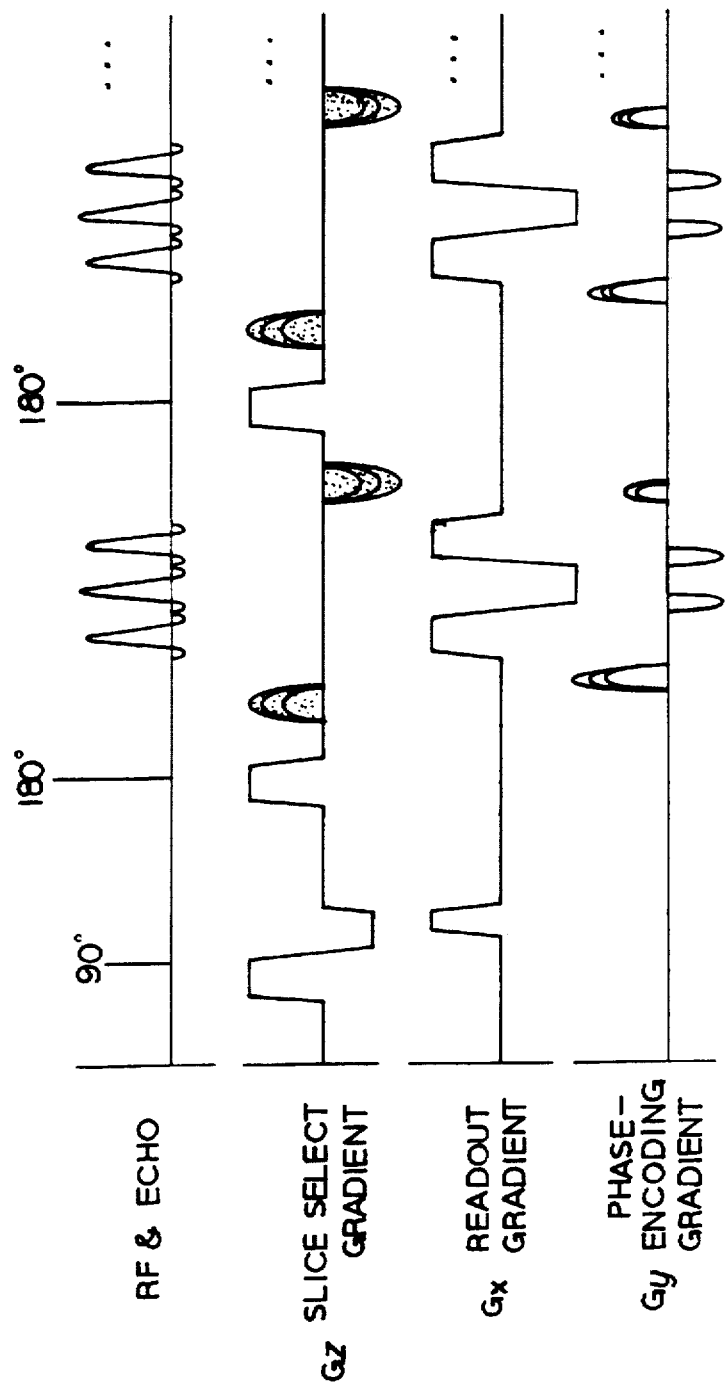
FIG. 3 shows a pulse sequence for use in three-dimensional imaging based on the conventional GRASE technique.
Figure 4:
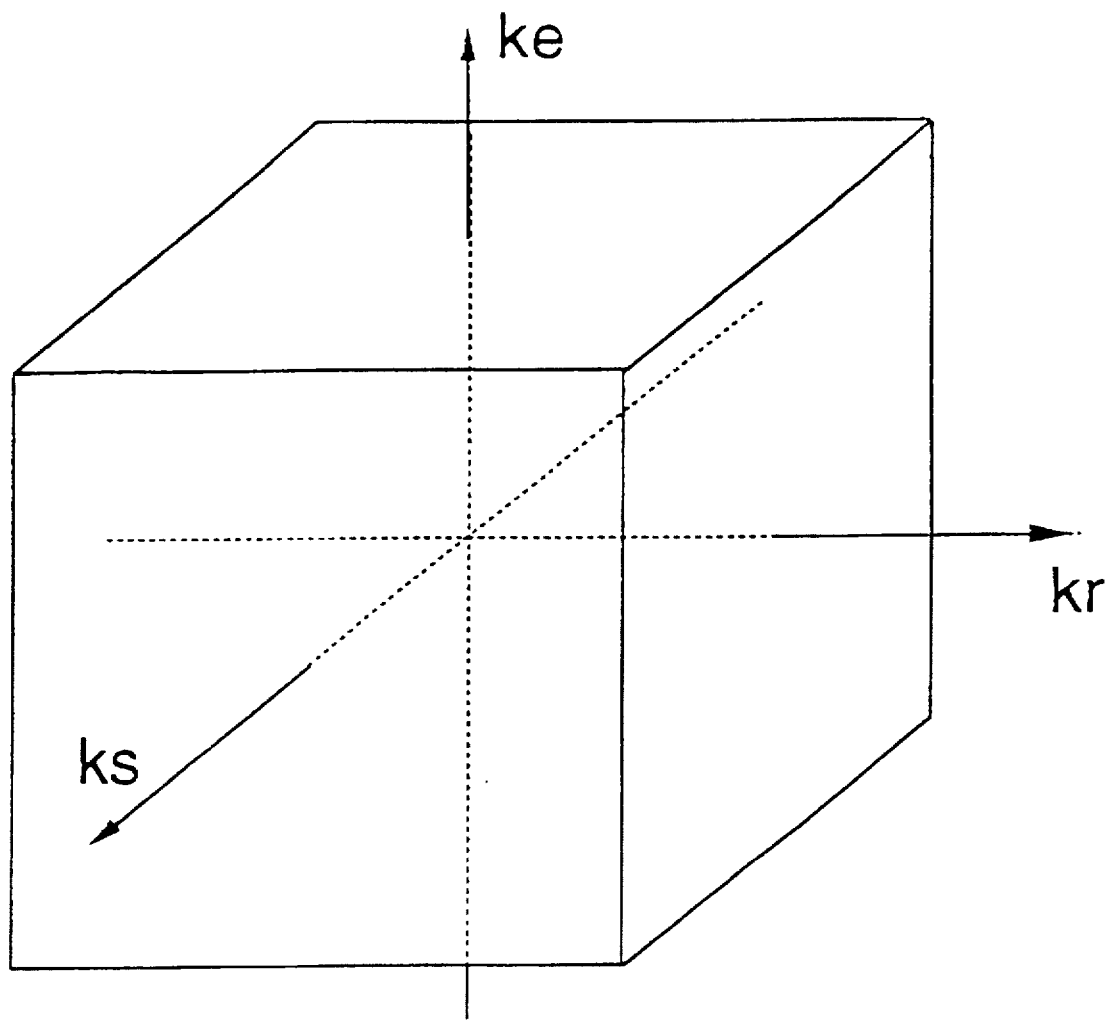
FIG. 4 is an explanatory diagram concerning a three-dimensional k-space.

At step 21, variables l, m, and n each of which is used as a count indicating the number of imaging sessions and incorporated in the sequencer are initialized to zeroes. At step 22, the size of a three-dimensional imaging matrix, the number of pixels, and required imaging parameters are read from the controller 6. According to the imaging parameters, the details of a pulse sequence for hybrid EVI imaging are determined. In this embodiment, a pulse sequence shown in FIG. 10 (for producing a three-dimensional image represented by a matrix, which has 25 elements in a direction of phase encoding and 25 elements in a direction of slice encoding, under the conditions that the numbers of 180° RF refocusing pulses (=$N_{RF}$) and gradient echoes (=$N_{GE}$) are 5 and the number of shots (=N) is 25) shall be employed. The pulse sequence corresponds to the one, which is shown in FIG. 3, employed in the aforesaid prior art.

Control is then passed to step 24. The order of acquiring MR data as elements of the three-dimensional matrix using the pulse sequence for hybrid EVI determined at step 23 is computed, and the order of mapping data into a three-dimensional k-space which depends on the order of acquiring MR data is determined. Information representing the order of mapping data is supplied to the data preprocessing unit 11.

Steps 25 and the steps thereafter are processed sequentially. At step 25, a standby state is set up and it is determined whether given timing has come. When given timing has come (the result of determination is in the affirmative), the RF sequencer 5b in the sequencer 5 commands the application of a 90° RF excitation pulse. At the same time, the gradient sequencer 5b commands the application of a pulse of slice selective magnetic field gradient $G_S$ (pulses A1 and A2 in FIG. 10).

Thereafter, it is determined at step 27 whether given timing has come. If given timing has come (the result of determination is in the affirmative), a pulse of readout magnetic field gradient $G_R$ called a spoiler pulse is applied at step 28 (Refer to pulse B in FIG. 3).

At step 29, the RF sequencer 5b commands the application of a 180° RF refocusing pulse. At the same time, the gradient sequencer 5a commands the application of a pulse of slice selective magnetic field gradient $G_S$ (Refer to pulses C1 and C2 in FIG. 3).

Control is then passed to step 30. Intensities of the magnetic field gradient $G_{E1}$ oriented in the direction of phase encoding and the magnetic field gradient $G_{E2}$ oriented in the direction of slice encoding which are imposed at every refocusing (i.e., spin inversion) for each excitation cycle are read out. The application of the pulses of magnetic field gradients $G_{E1}$ and $G_{E2}$ is commanded by the gradient sequencer 5a (Refer to pulses D1 and D2 in FIG. 3).

The pulse D1 of magnetic field gradient $G_{E1}$ oriented in the direction of phase encoding is variable stepwise for each shot in conformity with a magnitude of encoding ranging from a maximum negative magnitude of encoding (−12) to a specified minimum negative magnitude of encoding (−8). The pulse D1 corresponds to the base phase-encoding gradient pulse of the invention. In contrast, the pulse D2 of magnetic field gradient $G_{E2}$ oriented in the direction of slice encoding is variable stepwise for each excitation cycle composed of five shots in conformity with a magnitude of encoding ranging from a maximum negative magnitude of encoding (−12) to a maximum positive magnitude of encoding (+12). The magnetic field gradient $G_{E2}$ oriented in the direction of slice encoding is imposed at every refocusing as shown in FIG. 10. The magnitude of encoding varied at every refocusing differs from one refocusing to another. That is to say, in this embodiment, a magnitude of encoding ranging from −12 to −8 is associated with the first magnetic field gradient pulse $G_{E2}$. A magnitude of encoding ranging from −7 to −3 is associated with the second pulse. A magnitude of encoding ranging from −2 to +2 is associated with the third pulse. A magnitude of encoding ranging from +3 to +7 is associated with the fourth pulse. A magnitude of encoding ranging from +8 to +12 is associated with the fifth pulse. Thus, twenty-five locations in the direction ks of slice encoding of a matrix in which a three-dimensional k-space is expressed are sequentially padded with echo data during each excitation cycle (composed of five shots).

Control is then passed to step 31 in the sequencer 5, and it is commanded that the pulse of readout magnetic field gradient $G_R$ be applied with the polarity thereof reversed alternately five times. The sequencer 5 also commands that the pulse of magnetic field gradient $G_{E1}$ oriented in the direction of phase encoding be applied for each of locations concerned in the k-space synchronously with each of the second to fifth reversals of the readout magnetic field gradient pulse $G_R$ (Refer to pulses E1 and E2 in FIG. 3). With the reversal of the readout magnetic field gradient pulse $G_R$, five echoes are acquired by the RF coil 7 and receiver 8R according to the gradient echo imaging technique. The echoes are converted into digital data at a given sampling rate by means of the A/D converter 10. The digital data is then supplied to the data preprocessing unit 11. Each of the echoes is appended with a magnitude of encoding, which varies in units of five elements of the matrix, by adding a very small encoding pulse $P_{ed}$ whose pulse area is fixed and determined for a given set of locations (FIG. 10). The small encoding pulse $P_{ed}$ corresponds to the adjusting phase-encoding gradient pulse of the invention.

The data preprocessing unit 11 is, as mentioned above, provided with information representing the order of mapping data three-dimensionally. The data preprocessing unit 11 maps echo data provided by the A/D converter 10 into the three-dimensional k-pace virtually constructed in memory according to the order information.

At step 32, the sequencer 5 calculates variable I by adding 1 to the I value, and increments the number of refocusings triggered with application of a 180° RF refocusing pulse. It is determined at step 33 whether the number of refocusings I equals to a specified value of $I_R$; that is, five in this embodiment. If the result of determination is in the negative, rewinding pulses $-G_{E1}$ and $-G_{E2}$ relative to the pulses of magnetic field gradients $G_{E1}$ and $G_{E2}$ in two directions are applied as denoted with F1 and F2 in FIG. 3 (step 34). The rewinding pulses $-G_{E1}$ and $-G_{E2}$ are used to reset the magnitudes of encoding specifying locations in the three-dimensional k-space into which data is mapped to zeroes in the directions ke and ks at every application of a 180° RF refocusing pulse, whereby degradation of image quality due to stimulated echoes is avoided.

After the application of rewinding pulses is completed, control is returned to step 29. The aforesaid processing of steps 29 to 33 (or 34) is repeated given times; that is, five times in this embodiment. Thus, the first shot (excitation cycle) is completed. Specifically, one pulse train of the pulse sequence, which is shown in FIG. 10, produced during the first shot has been processed to acquire 25 echo data sets using the pulses of magnetic field gradients $G_{E1}$ and $G_{E2}$ oriented in two directions of encoding according to the associated magnitudes of encoding (See FIGS. 11 and 12A which will be described later).

When the first shot is completed, the sequencer 5 passes control to step 35. Variable I is reset to zero, and another variable m representing the number of imaging sessions is incremented by one. It is determined at step 36 whether variable m is equal to a specified value of $m_R$ that is five here. If the result of determination is in the negative, it means that the given number of shots constituting one excitation cycle has not been burst. The magnitude of encoding set for the pulse of magnetic field gradient $G_{E1}$ oriented in the direction of phase encoding is incremented by one at step 37, for example, from −12 to −11.

Control is then returned to step 25. An excitation cycle achieved by processing steps 25 to 36 is repeated.

While the excitation cycle is being repeated, if the number of imaging sessions, m, reaches the specified value of 5 that is the number of shots constituting one excitation cycle, control is passed from step 36 to 38 in the sequencer 5. Variables I and m are reset to zeroes, another variable representing the number of imaging sessions, n, is incremented by one.

It is determined at step 39 whether the variable representing the number of imaging sessions, n, becomes equal to a specified value of $n_R$ that is five here. If the result of determination is in the negative, it is recognized that acquisition of echoes covering the three-dimensional matrix has not been completed. Control is then passed to step 40.

At step 40, the magnitude of encoding associated with the pulse of magnetic field gradient $G_{E2}$ oriented in the direction of slice encoding is incremented by one that indicates one location in the k-space. Specifically, the magnitude of encoding is changed from −12 to −11 for the first refocusing triggered by the first 180° RF pulse in FIG. 10. It is changed from −7 to −6 for the second refocusing. It is changed from −2 to −1 for the third refocusing. It is changed from +3 to +4 for the fourth refocusing. It is changed from +8 to +9 for the fifth refocusing. The magnitudes of encoding associated with the rewinding pulses are decremented by values corresponding the increments.

Control is then returned to step 25 in the sequencer 5. The aforesaid processing of steps 25 to 39 (40) is repeated. If the result of the determination made at step 39 to see if variable n equals to a specified value of five is in the affirmative, it means that five shots constituting one excitation cycle are completed. It is recognized that echo data serving as all elements of the three-dimensional matrix has been acquired. The sequencer 5 is then terminated.

While the sequencer 5 is operating, the data preprocessing unit 11 maps echo data into the three-dimensional k-space. The echo data mapped is sent to the reconstruction unit 12 and then subjected to three-dimensional Fourier transform in order to produce a three-dimensional reconstructed image. The three-dimensional image data is stored in the storage unit 13.

The data preprocessing unit 11 may temporarily store echo data sent from the A/D converter 10 in the order of receiving echo data. After all echo data is received, it may be reordered in the k-space according to data map information so that the locations of echo data will match the positions of elements in the three-dimensional matrix.

The sequencer 5 controls, as mentioned above, a pulse sequence produced by hybrid EVI. The magnitude of encoding associated with the pulse of magnetic field gradient $G_{E2}$ oriented in the direction of slice encoding is set to a value of a range predetermined for respective blocks each consisting of five elements of the matrix at every application of a 180° RF refocusing pulse. The magnitude of encoding associated with the pulse of magnetic field gradient $G_{E1}$ oriented in the direction of phase encoding is varied in units of five elements of the matrix. Thus, an imaging sequence consisting of a total of 25 shots is repeated.

When the pulse of magnetic field gradient $G_{E1}$ oriented in the direction of phase encoding is applied as mentioned above, unlike when it is applied according to the prior art, five (=$N_{GE}$) echoes produced after each of the 180° RF refocusing pulses are used to acquire data to be mapped into a two-dimensional k-space defined with the directions of phase encoding and readout. When the pulse of magnetic field gradient $G_{E2}$ oriented in the direction of slice encoding is applied as mentioned above, similarly to when it is applied according to fast spin echo imaging, a magnitude of encoding (a location of a k-space into which data is mapped) can be varied gradually with the application of a 180° RF refocusing pulse. When partial echo data has been acquired and mapped into the two-dimensional space defined with the directions of phase encoding and readout, acquiring and mapping of echo data is shifted to an adjacent two-dimensional space during one shot. The same processing is then carried out relative to locations of the space lined in the direction of slice encoding which are specified with a magnitude of encoding during one shot.

Figure 5:
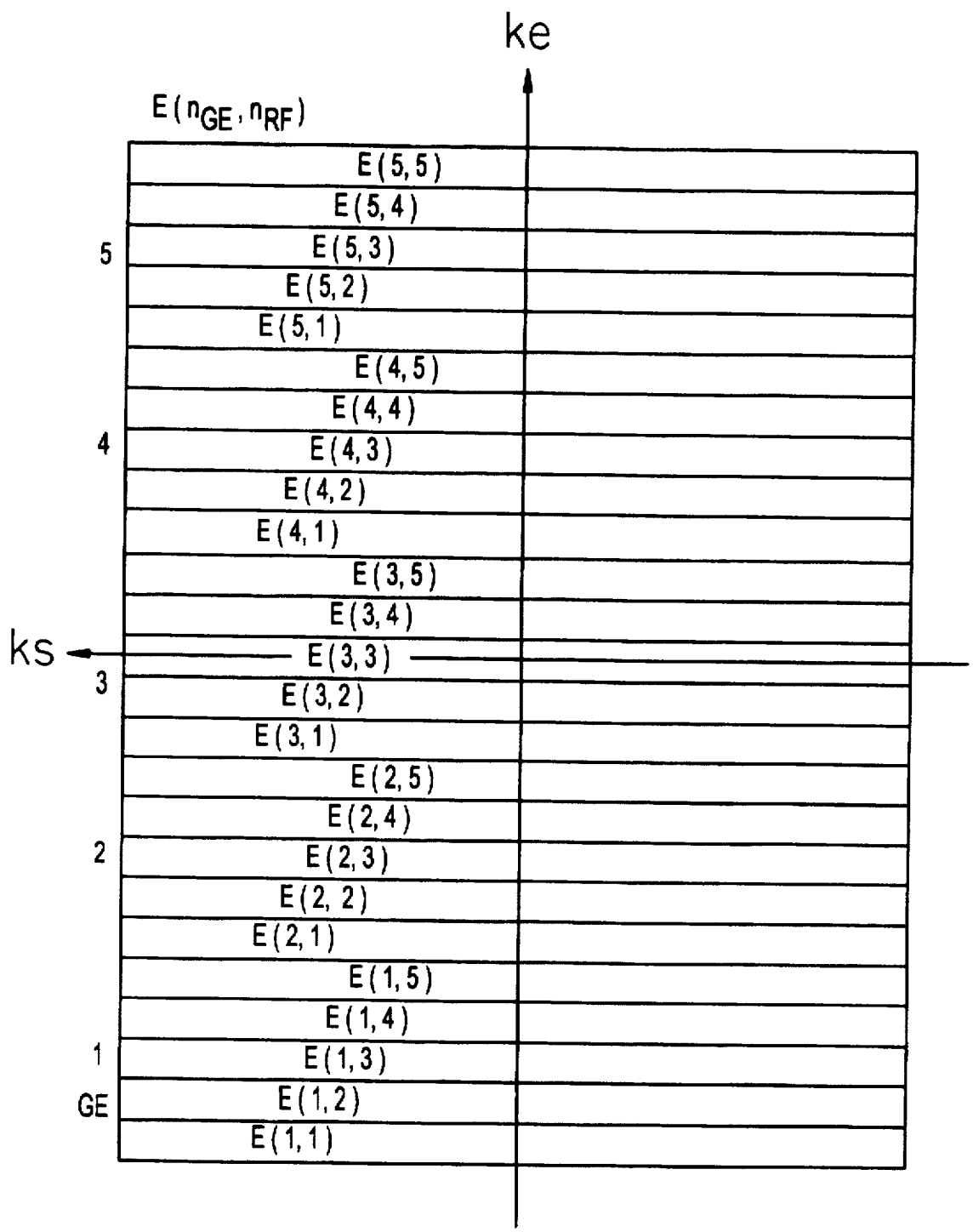
FIG. 5 schematically shows a data map on a ke-ks section of a conventional three-dimensional k-space.
Figure 11:
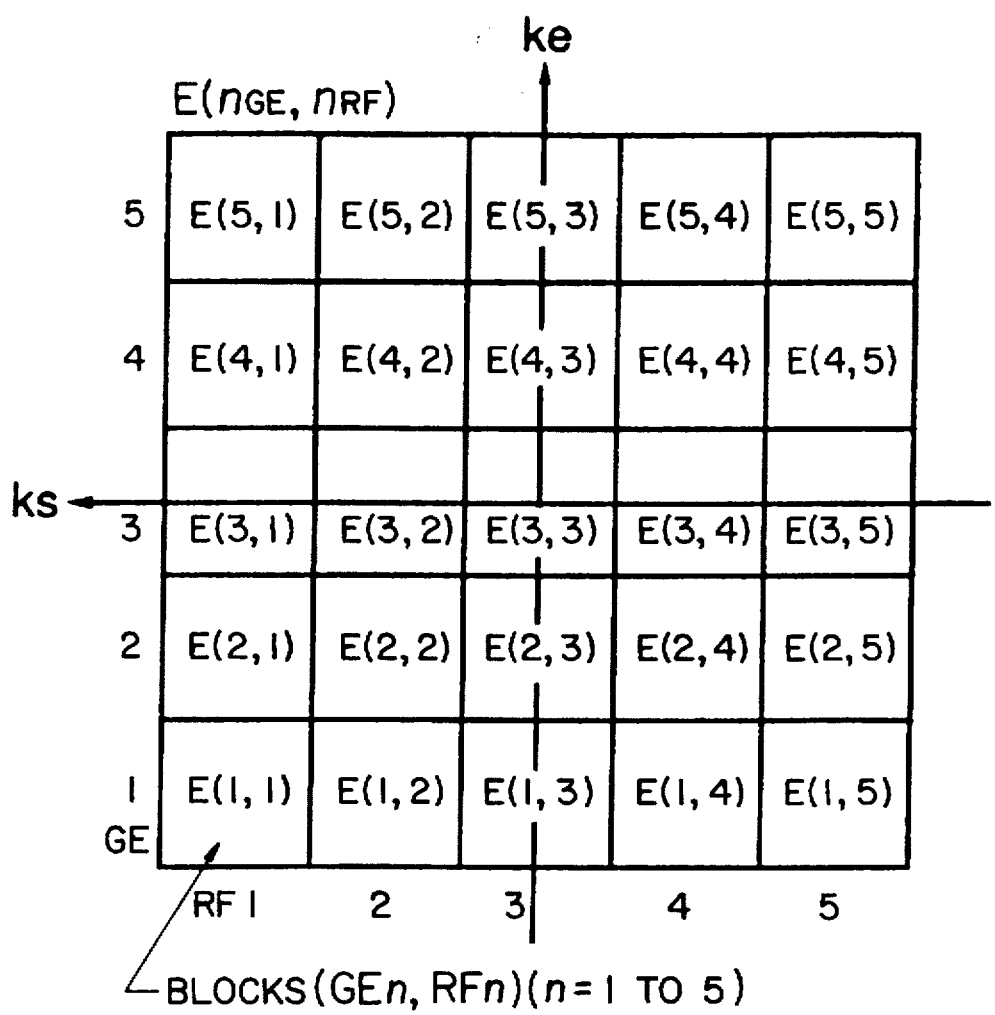
FIG. 11 schematically shows a data map on a ke-ks section of a three-dimensional k-space.

FIGS. 11 and 12 show data mapping. FIG. 11 shows a data map in a k-space corresponding to the conventional one shown in FIG. 5. The k-space of FIG. 11 is divided into five (=$N_{RF}$) blocks in the direction ks of slice encoding (determined with the number of RF pulses), into which data is mapped. Each of the blocks is not divided into sub-blocks the number of which is determined with the number of RF pulses; that is, is not nested unlike the one in the conventional space (See FIG. 5). In the direction ks of slice encoding in the space, data acquired with 180° RF refocusing pulses RF1 to RF5 is mapped similarly to the one according to fast spin echo imaging. Consequently, as shown in FIG. 11, mapping blocks (GEn, RFn) (where n equals to 1 to 5) are virtually formed on a ke-ks plane.

Figure 6A:
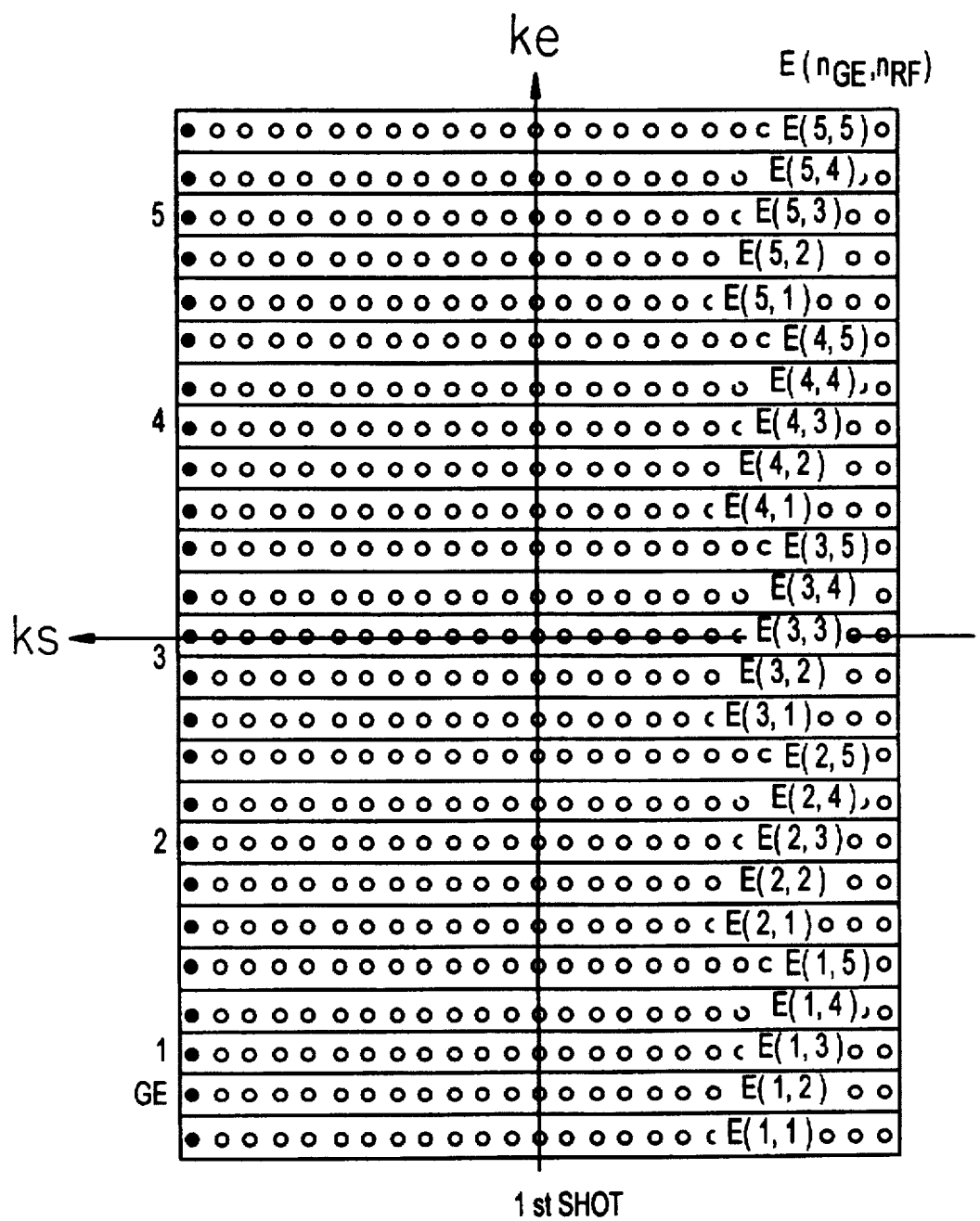
FIG. 6A schematically shows the order of mapping data onto the ke-ks section of the conventional three-dimensional k-space during the first shot.
Figure 6B:
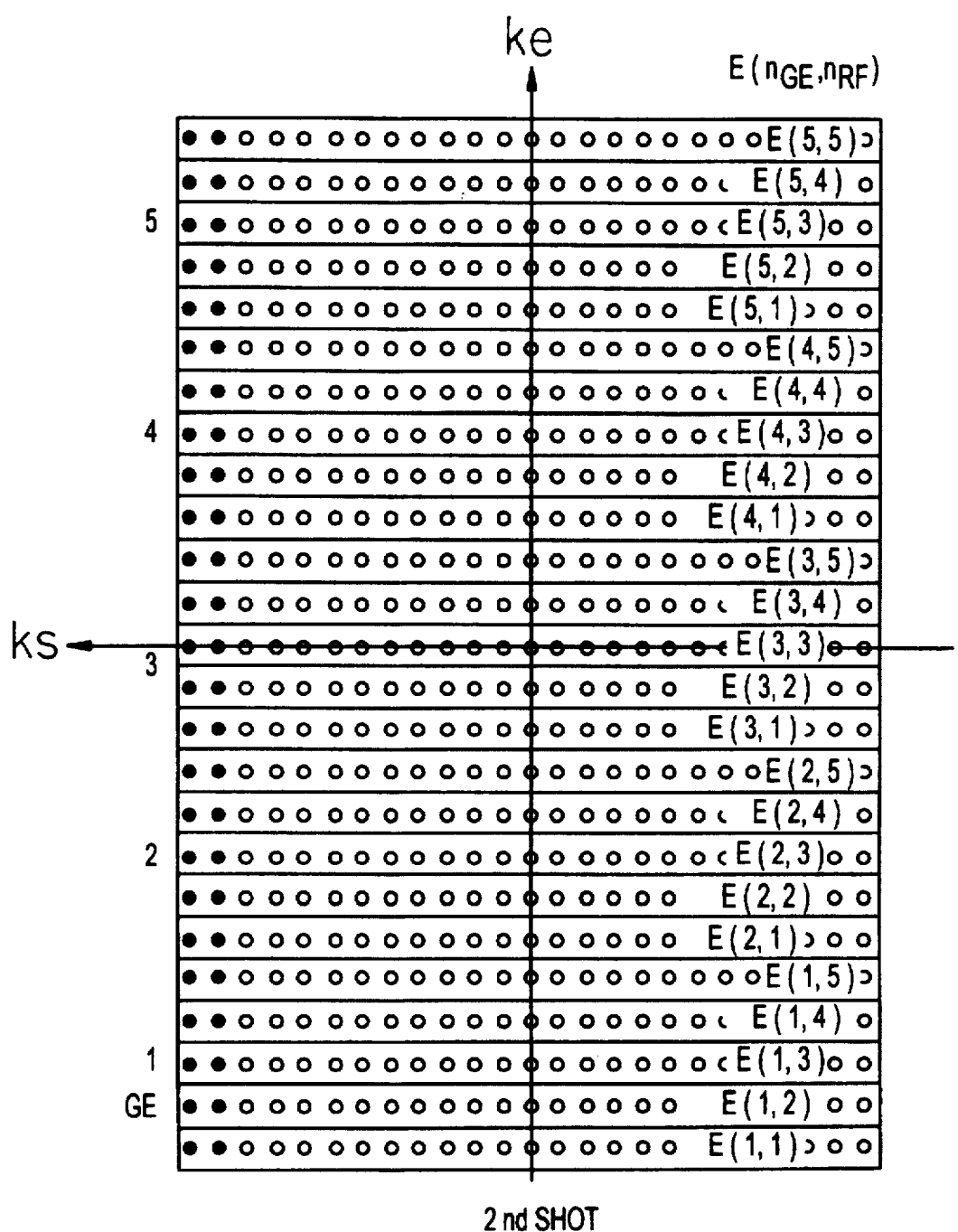
FIG. 6B schematically shows the order of mapping data onto the ke-ks section of the conventional three-dimensional k-space during the second shot.
Figure 12A:
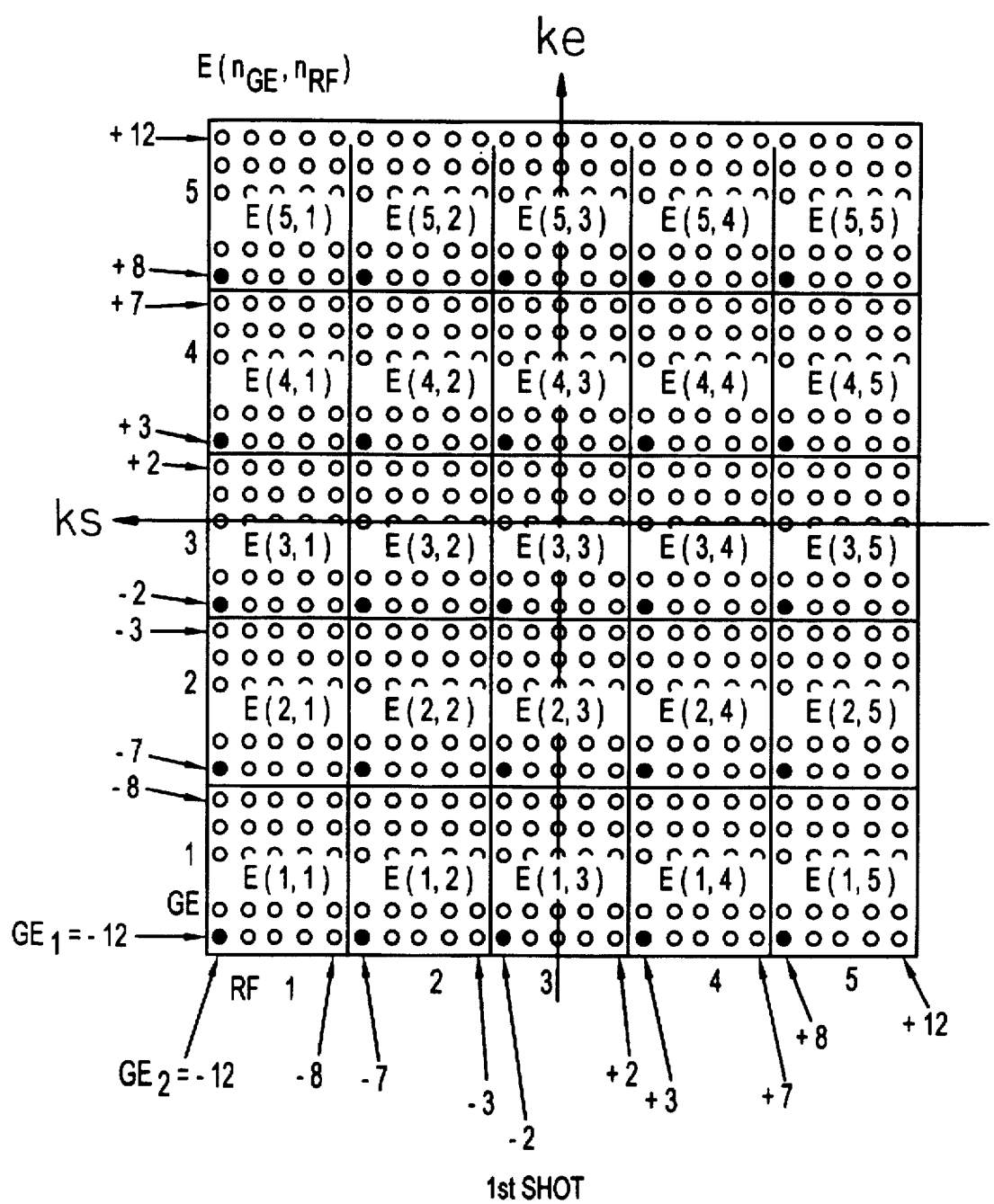
FIG. 12A schematically shows the order of mapping data onto a ke-ks section during the first shot.
Figure 12B:
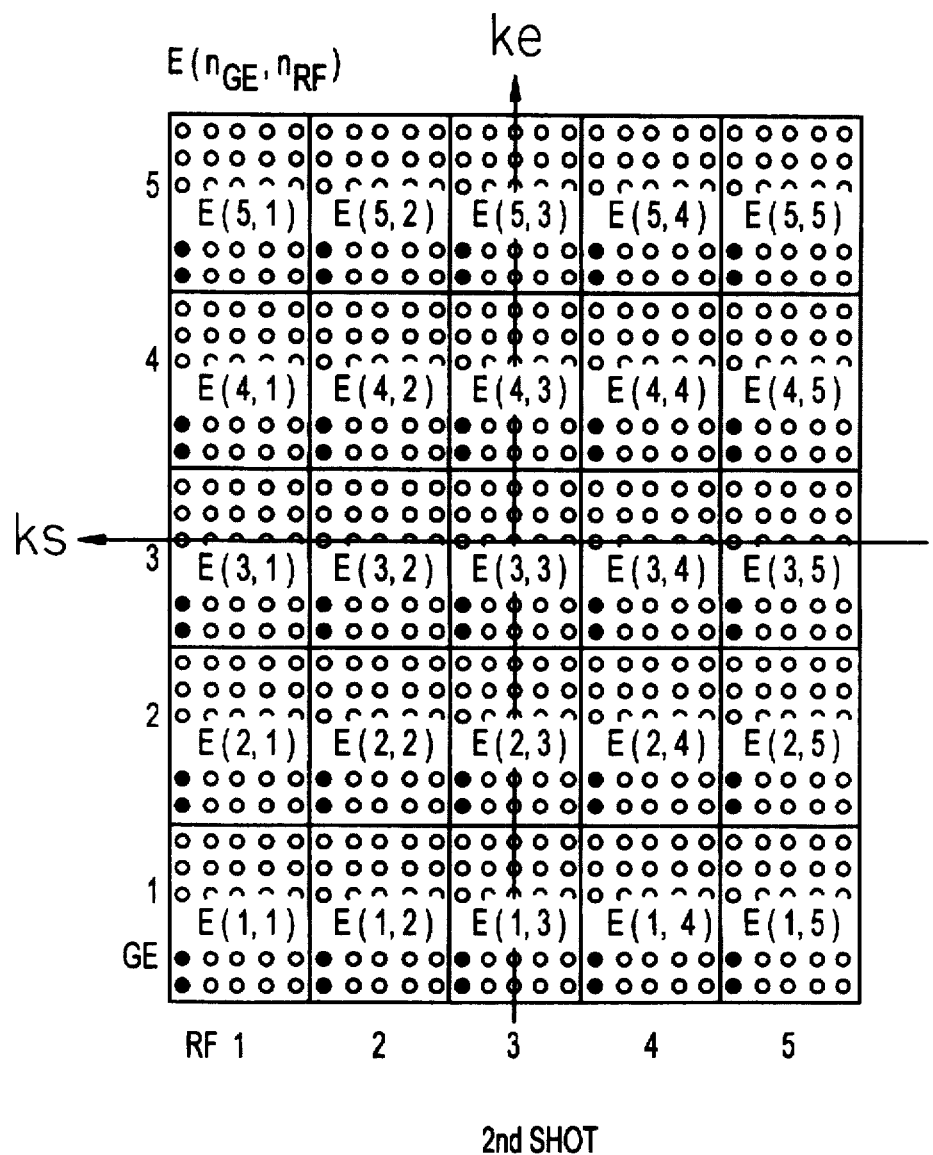
FIG. 12B schematically shows the order of mapping data onto the ke-ks section during the second shot.

FIGS. 12A and 12B schematically show acquiring and mapping of data produced during the first shot and second shot. FIGS. 12A and 12B correspond to FIGS. 6A and 6B. During the first shot (excitation cycle), as shown in FIG. 12A, echo data is acquired and mapped into 25 locations indicated with black dots at the left lower corners of the mapping blocks (GEn, RFn). During the second shot, as shown in FIG. 12B, echo data is acquired and mapped into 25 locations specified above the first locations in the direction ke and indicated with black dots. Thus, when the shot is repeated 25 times, all locations in each of the mapping blocks (GEn, RFn) (where n equals to 1 to 5), that is, all the ke-ks planes are completely padded with echo data. As shown in FIGS. 11 and 12, echo data produced with an $n_{GE}$-th readout magnetic field gradient pulse applied after an $n_{RF}$-th 180° RF refocusing pulse during each shot is mapped exclusively into a virtual mapping block (GEn, RFn).

FIGS. 13A and 13B schematically show the directions of mapping data in a readout direction kr in this embodiment. FIG. 13A shows the direction of mapping data produced with 180° RF refocusing pulses of $n_{RF}$=3 in the direction ks of slice encoding. FIG. 13A shows the direction of mapping data produced with readout magnetic field gradient pulses of $n_{GE}$=3 in the direction ke of phase encoding. As shown in FIG. 13A, echo data whose associated readout magnetic field gradient pulses ($n_{GE}$) are different from one another are mapped into locations in the direction ke. The direction (order) of mapping data in the direction of readout is reversed with the reversal of the polarity of a pulse of readout magnetic field gradient applied during echo data acquisition. This is true for EPI or interleaved EPI. In FIG.

13B, the direction of mapping data remains unchanged. For even readout magnetic field gradients ($n_{GE}$), the direction of mapping data is the reverse.

Figure 7A:
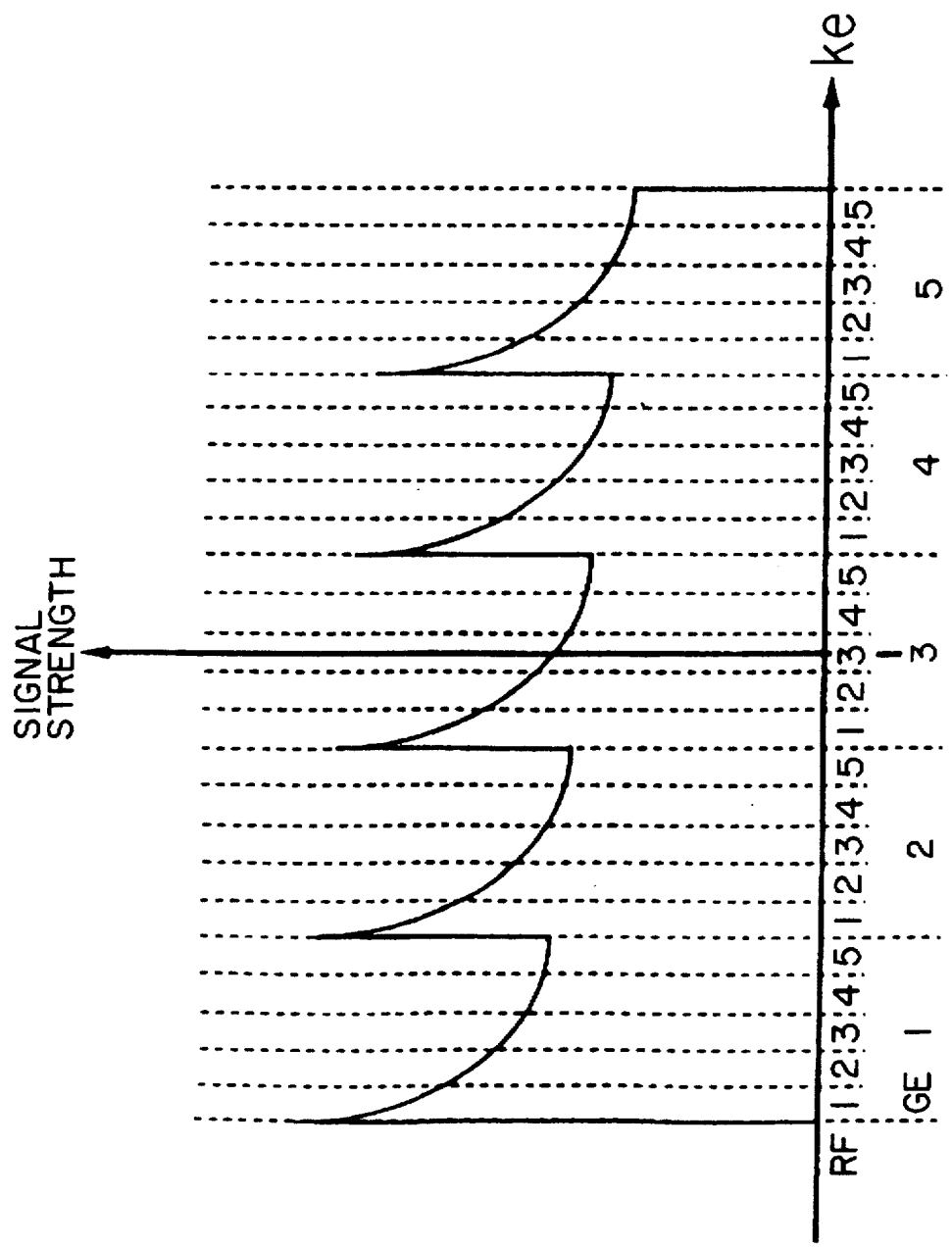
FIG. 7A is a graph plotted to indicate a change in signal strength in a direction ke which is typical of the conventional GRASE imaging.
Figure 7B:
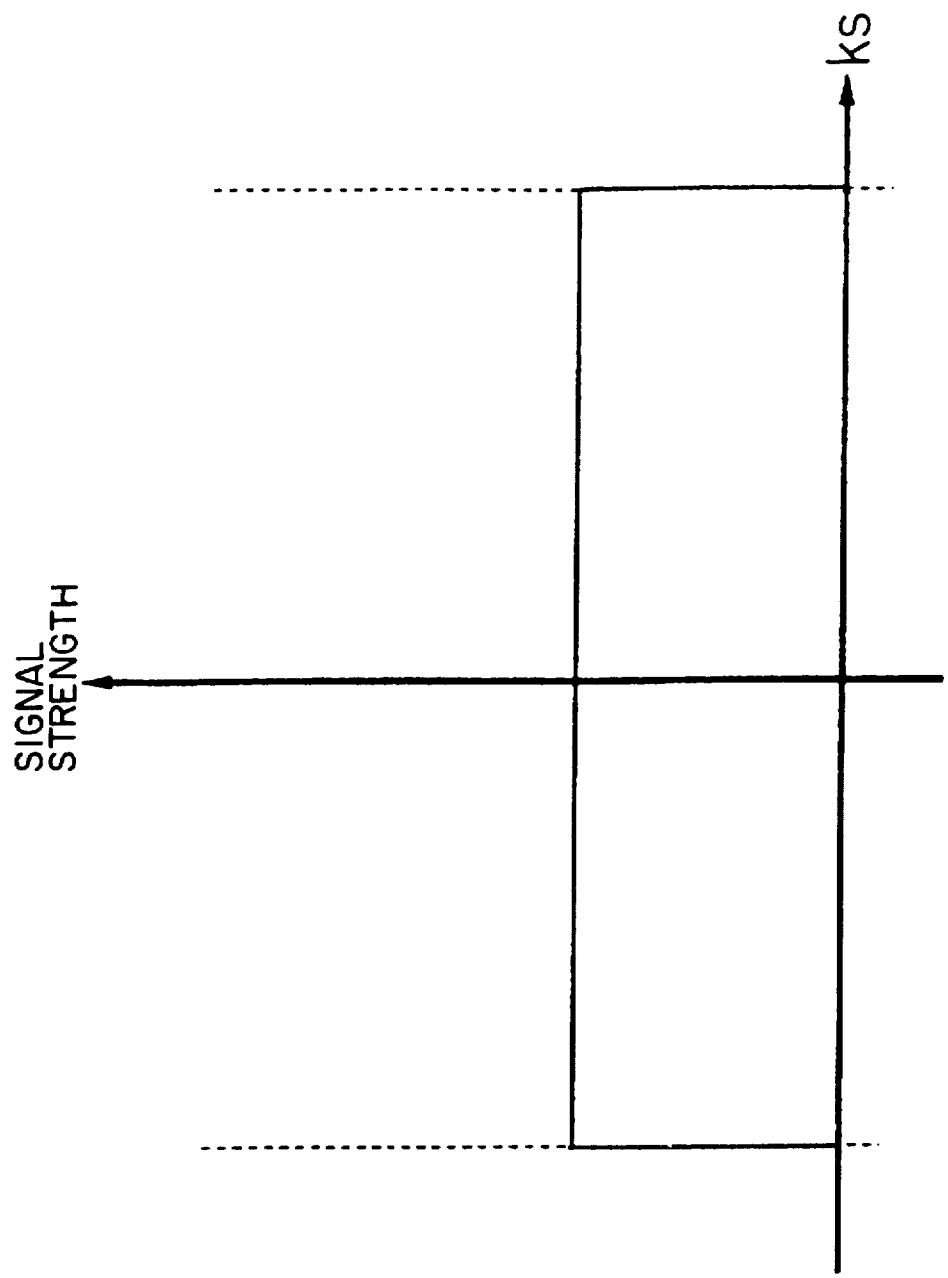
FIG. 7B is a graph plotted to indicate a change in signal strength in a direction ks which is typical of the conventional GRASE imaging.
Figure 14A:
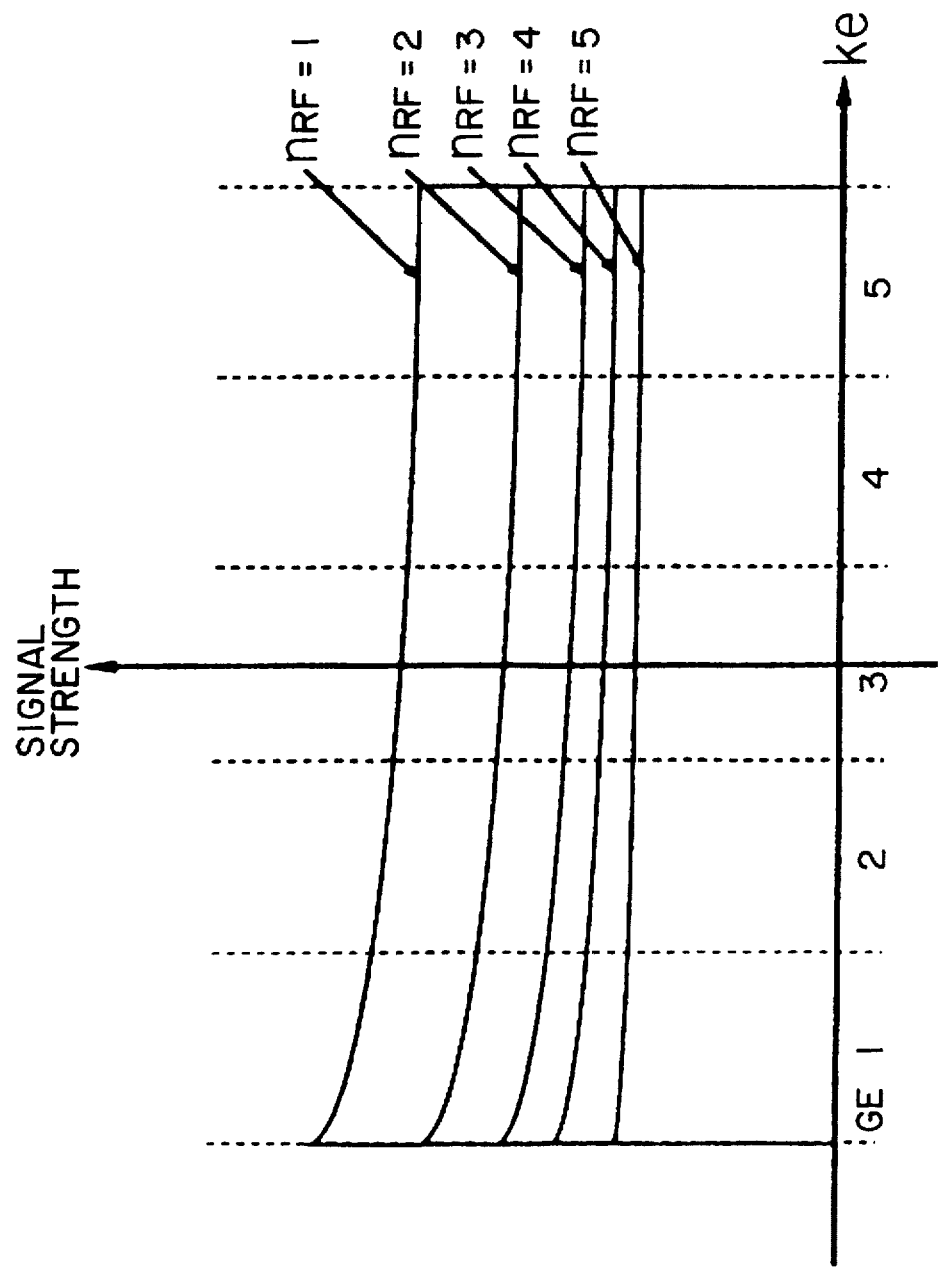
FIG. 14A is a graph plotted to indicate a change in signal strength in a direction ke.

FIGS. 14A and 14B schematically show changes in signal strength due to T2 decay of echo data acquired in this embodiment. FIGS. 14A and 14B are comparable to FIGS. 7A and 7B showing changes in signal strength according to the prior art. In practice, data produced with the same readout magnetic field gradient pulse or RF pulse may have the same signal strength and the signal strength may change stepwise. FIGS. 14A and 14B are intended merely to provide an overall idea of a change. The change in signal strength in the direction ke varies with the location arranged in the direction ks. The change in signal strength is therefore plotted for each of RF pulses constituting one pulse sequence (See FIG. 14A). As seen from FIGS. 14A and 14B, when imaging is carried out according to this embodiment, although a monotonous change in signal strength resulting from T2 decay remains throughout a k-space, a GRASE-specific periodic change in signal strength is eliminated. Consequently, ringing artifacts are eliminated or substantially reduced. In particular, defocusing arising in the direction of phase encoding due to T2 decay is suppressed satisfactorily. This results in improved image quality.

For acquiring two-dimensional data with the readout and phase encoding directions, the number of shots (excitation cycles) required would be $N_{se}$-fold of the one required according to the prior art. However, since data to be encoded in the direction of slice encoding can be acquired by performing a one-$N_{se}$-th number of shots of the number of shots required by the prior art. Consequently, imaging time required does not differ between this embodiment and the prior art. Moreover, pixel misregistration in the direction of phase encoding due to a chemical shift remains unchanged from that in the prior art. Echo time shifting can be achieved in the same fashion as that in the prior art.

According to this embodiment, as mentioned above, occurrence of GRASE-specific ringing (ghosts) artifacts attributable to T2 decay is reduced drastically for hybrid EVI. This results in improved image resolution. This means that high-quality images can be produced without signal averaging. Compared with imaging accompanied by signal averaging, imaging in accordance with this embodiment requires short imaging time. Compensation for T2 decay becomes unnecessary or simpler, whereby data acquisition or image reconstruction becomes easier. Moreover, when the number of echoes is fixed, freedom in determining the number of elements of a matrix defined in the direction of phase encoding becomes greater than that permitted by conventional GRASE imaging.

Moreover, contrary to the foregoing conventional "Echo-Volume Imaging" by Allen W. Song et al., the hybrid EVI uses the spoiler gradient pulse in the readout direction, thus achieving faster imaging and suppression of FID signals generated by refocusing pulses. The number of shots is not limited to one, but one or more, thereby being higher in usefulness. Further, slice-selective excitation is carried out for not only 90° RF excitation but also the 180° RF refocusing, preventing mixing of signals, such as noises and FID signals, which are not required for imaging.

Next, variants of the present invention will be described in conjunction with FIGS. 15 to 22.

Figure 15:
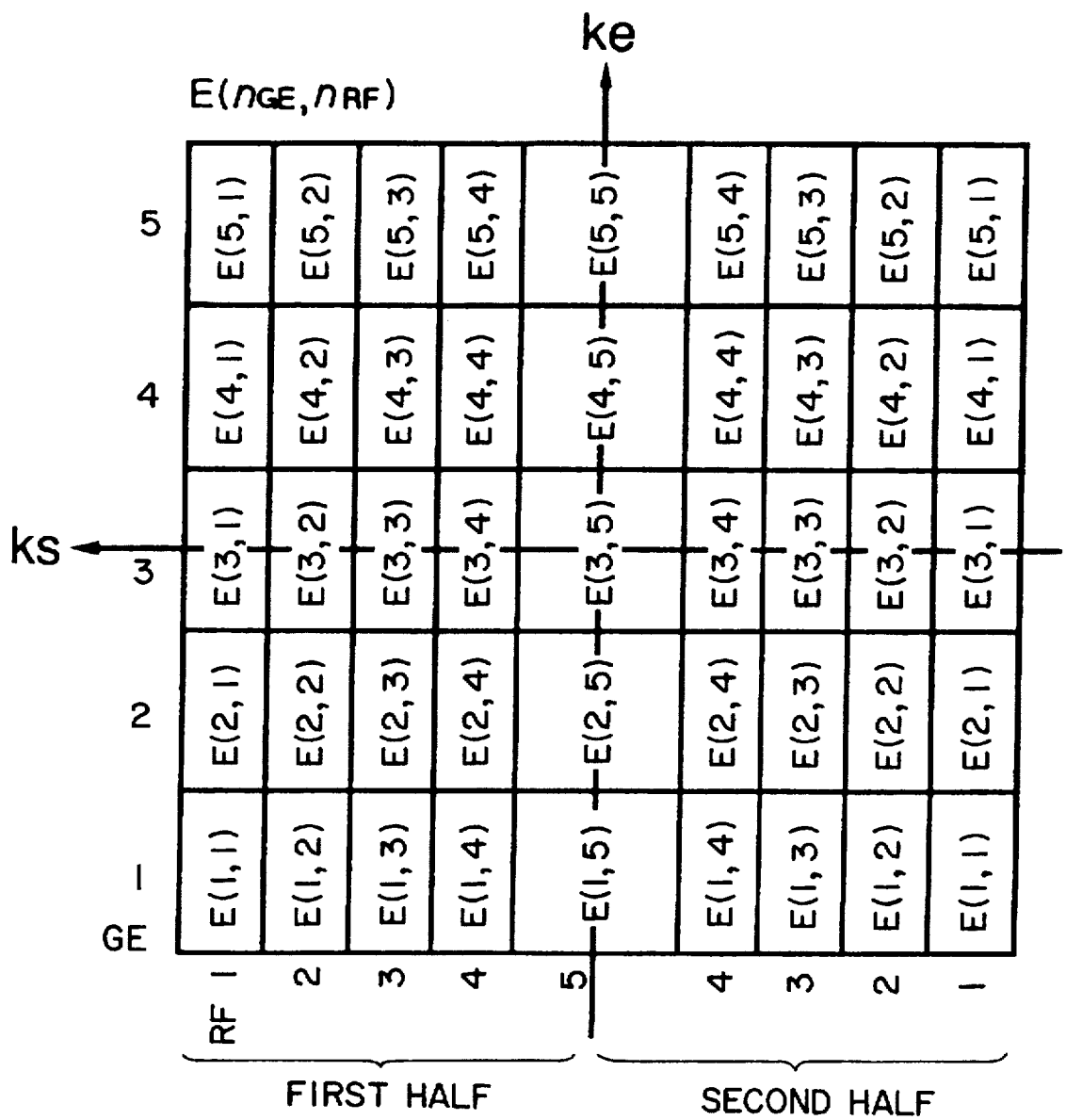
FIG. 15 schematically shows a data map on a ke-ks section of a two-dimensional k-space in the first variant.
Figure 16:
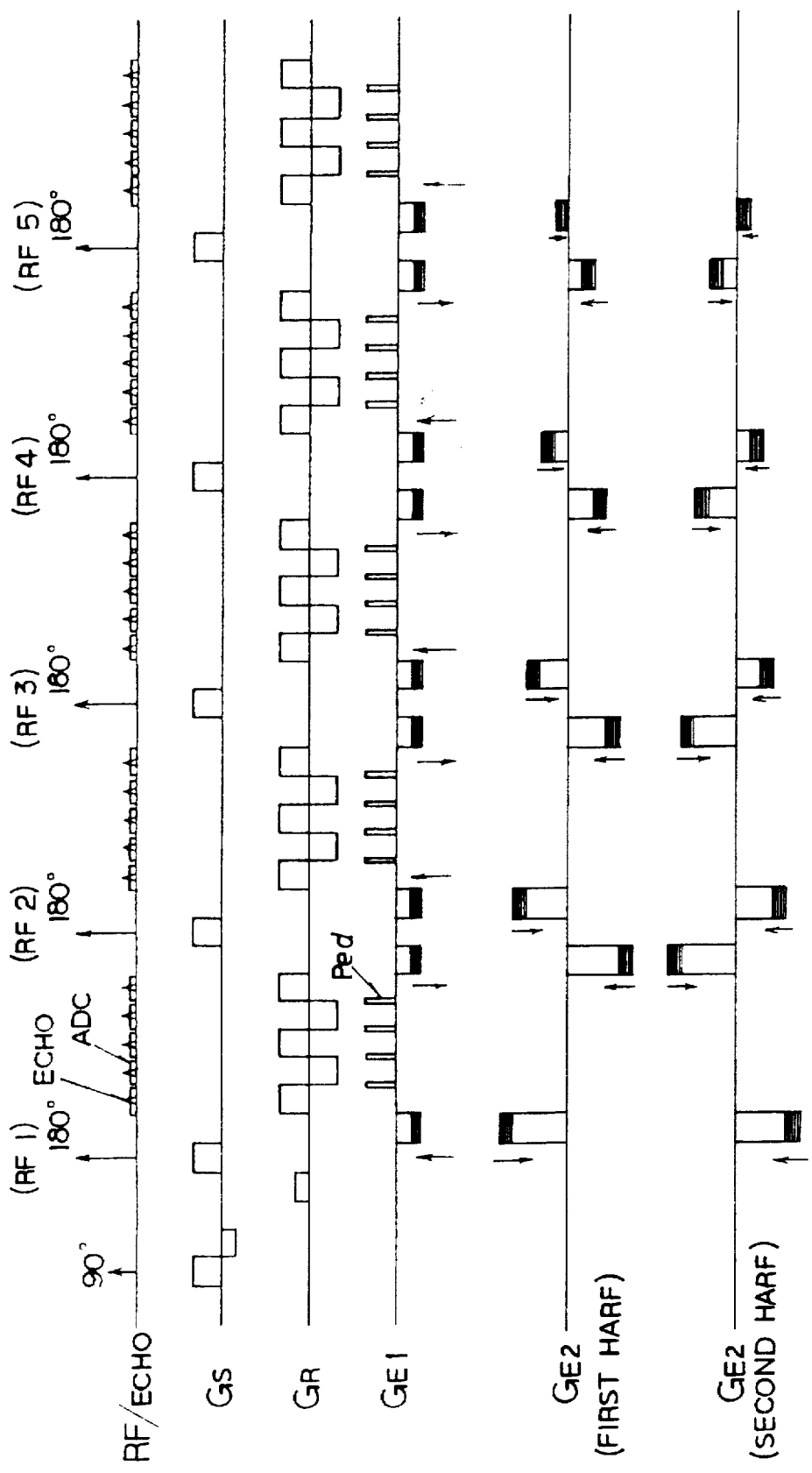
FIG. 16 shows a pulse sequence provided by hybrid EVI in the first variant.

FIG. 15 shows the first variant. As illustrated, one three-dimensional data set is acquired during two imaging sessions. Data is encoded and mapped into the direction ks of slice encoding as if it were processed by a high-pass filter. Specifically, locations with high spatial frequencies in the direction of slice encoding are padded with echo data produced with short echo time (hereinafter TE). This results in a sharp image with high resolution. Such data mapping is carried out with a pulse sequence shown in FIG. 16, which is commanded from the sequencer 5 in a similar manner described in the foregoing embodiment.

Alternatively, locations with low spatial frequencies in the direction of slice encoding may be padded with echo data produced with short TE. This results in an image with a high signal-to-noise ratio.

Figure 17:
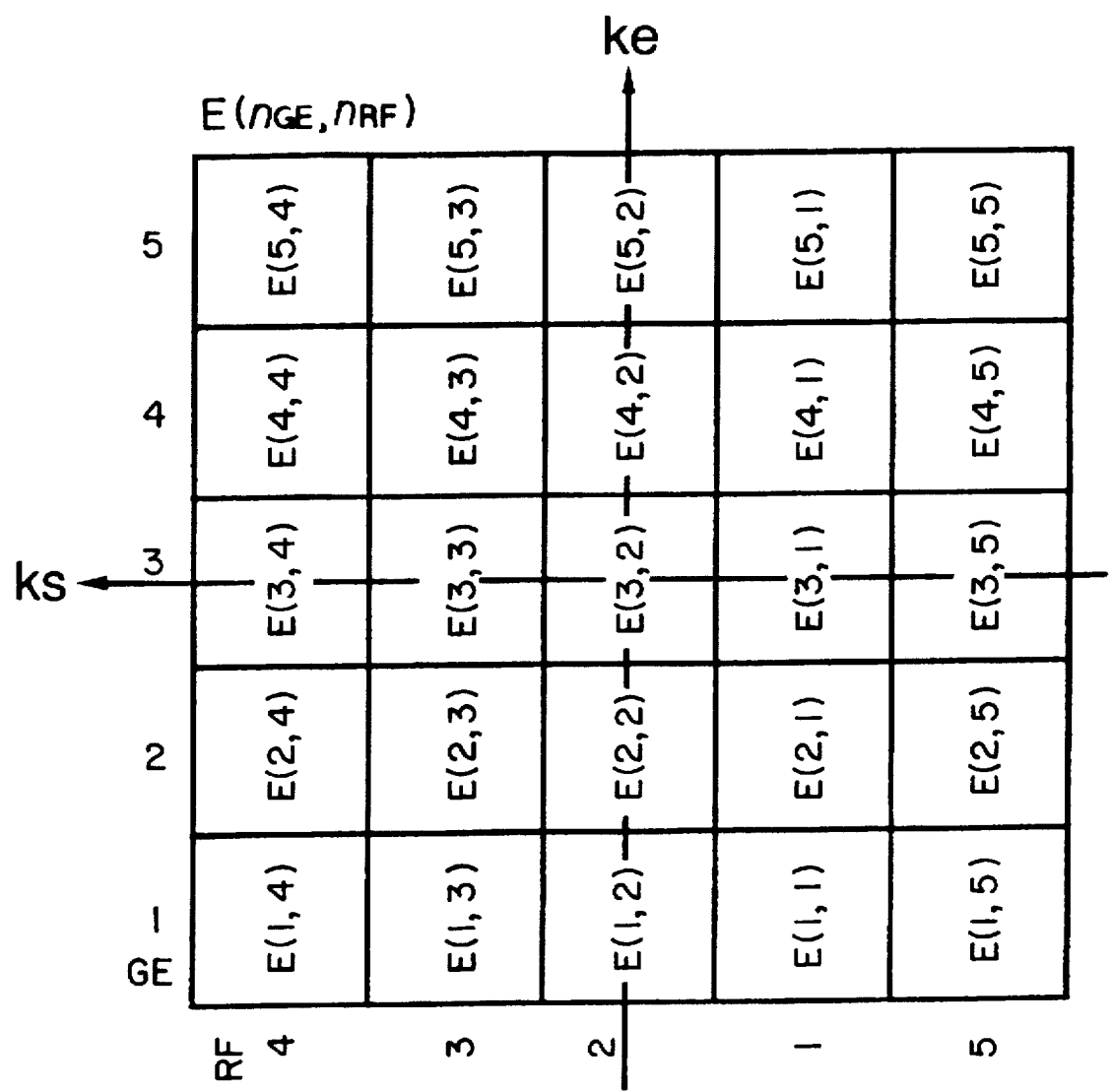
FIG. 17 schematically shows a data map on a ke-ks section of a two-dimensional k-space in the second variant.
Figure 18:
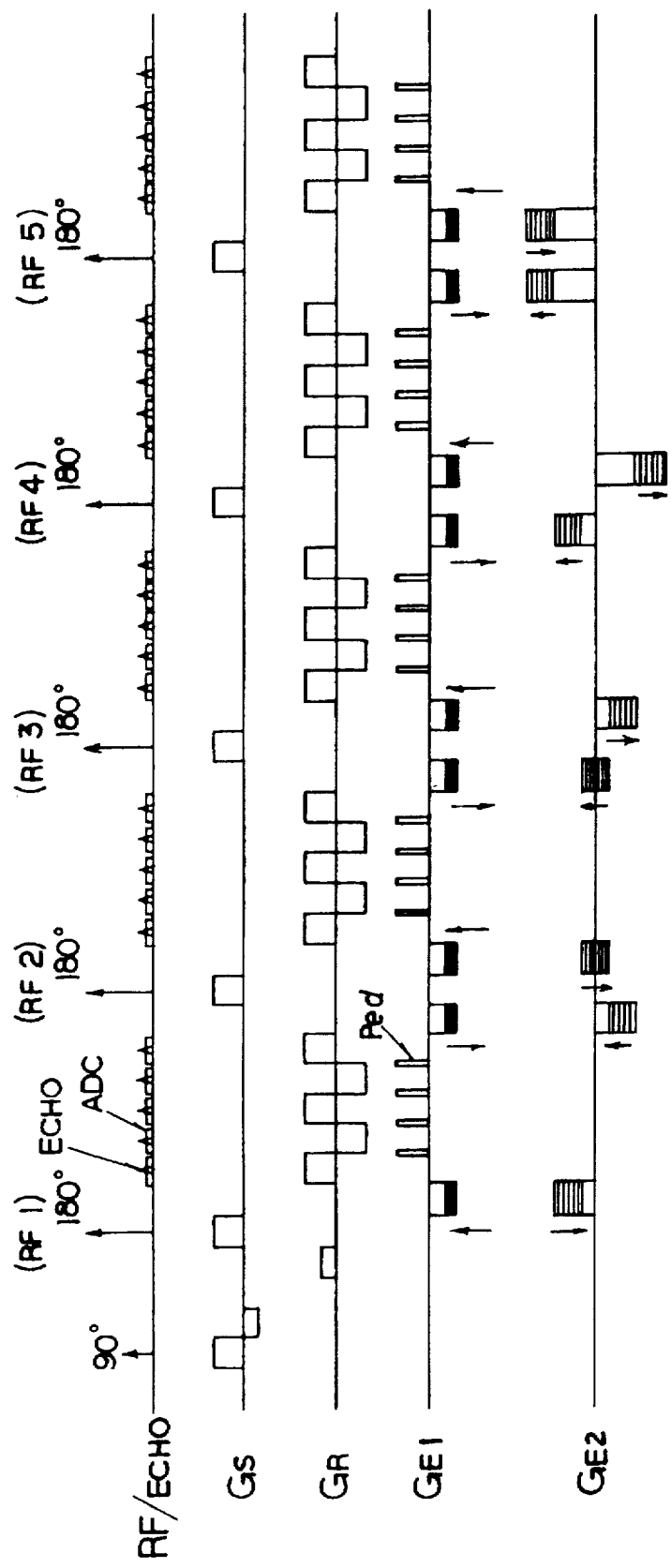
FIG. 18 shows a pulse sequence provided by hybrid EVI in the second variant.
Figure 19:
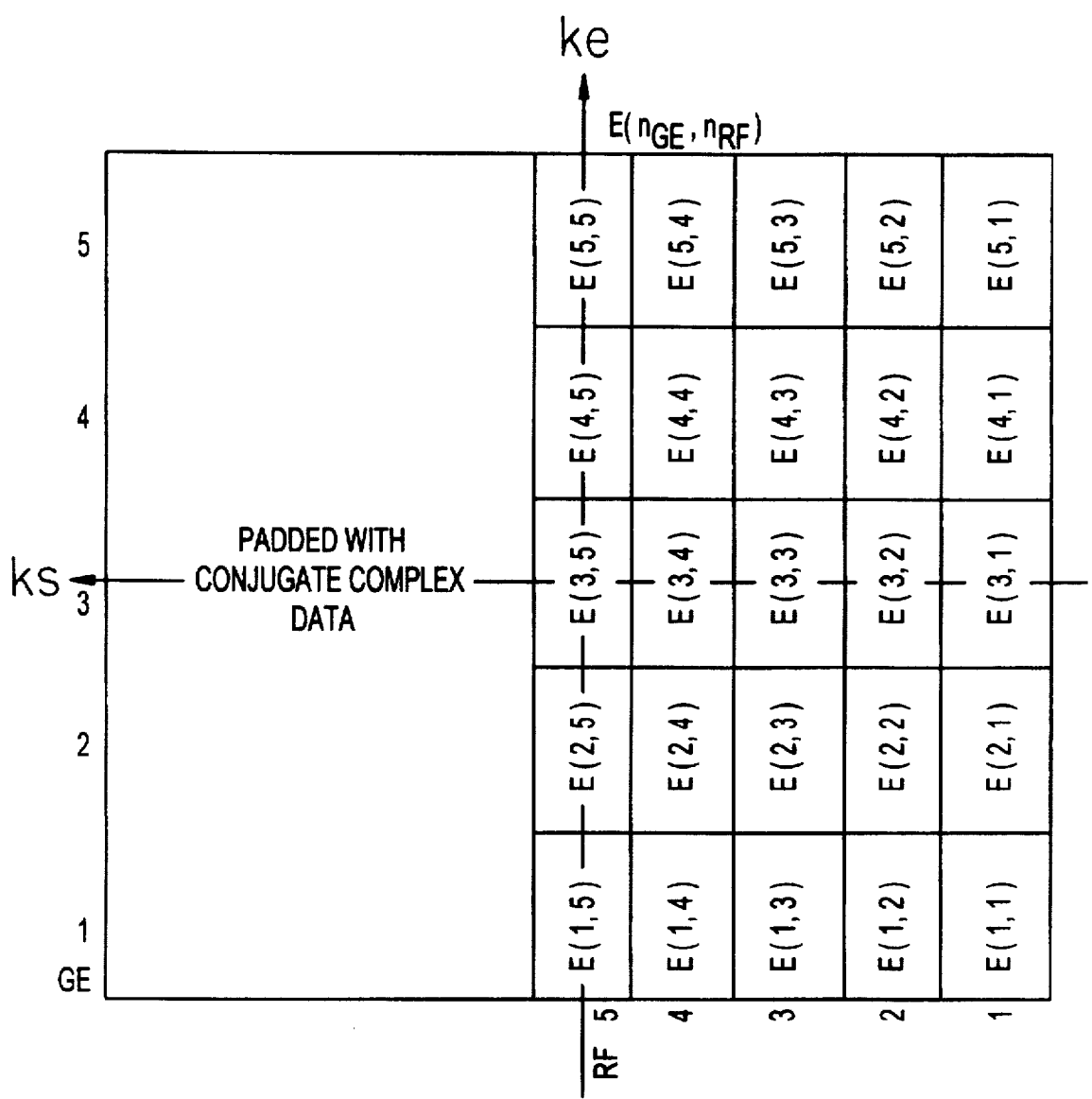
FIG. 19 schematically shows a data map on a ke-ks section of a two-dimensional k-space in the third variant.
Figure 20:
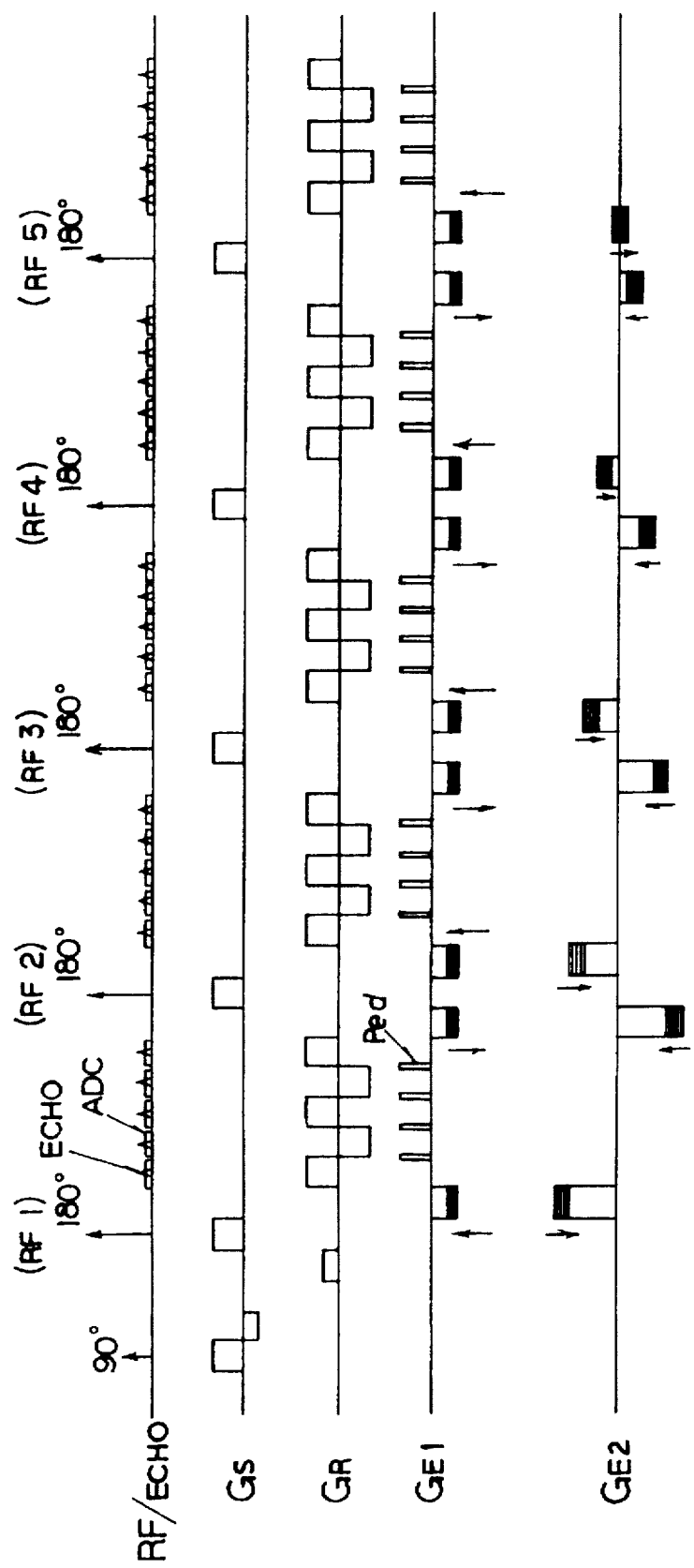
FIG. 20 shows a pulse sequence provided by hybrid EVI in the third variant.

FIG. 17 shows the second variant. Echoes are shifted relative to locations in the direction of slice encoding in a k-space. Echo data is mapped using a "scrolling" technique whose pulse sequence exemplified in FIG. 18 is carried out by the sequencer 5. This technique makes it possible to set a TE associated with the location at the center of a k-space to any value. Consequently, various T2 contrast can be achieved. The third variant will be described in conjunction with FIG. 19. As seen from the figure, a pulse sequence in this variant is used to acquire echo data to be mapped into about half of a k-space. A pulse sequence carried out by the sequencer 5 is shown in FIG. 20. Conjugate complex data of the acquired echo data is calculated and allotted to the remaining half of the k-space in the data preprocessing unit 11. Using this half phase encoding technique, scanning can be achieved faster.

Figure 21A:
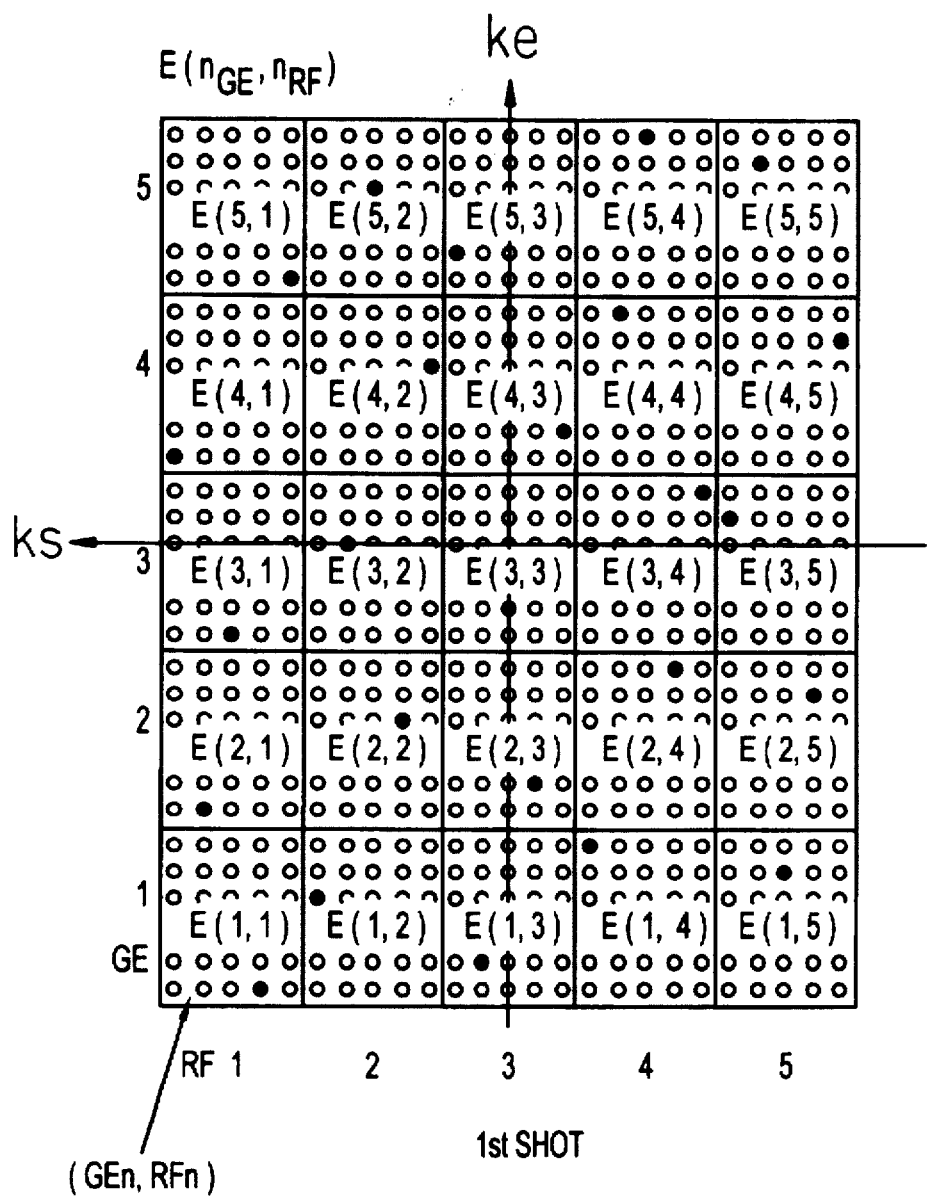
FIG. 21A schematically shows the order of mapping data onto a ke-ks section of a three-dimensional k-space during the first shot in the fourth variant.
Figure 21B:
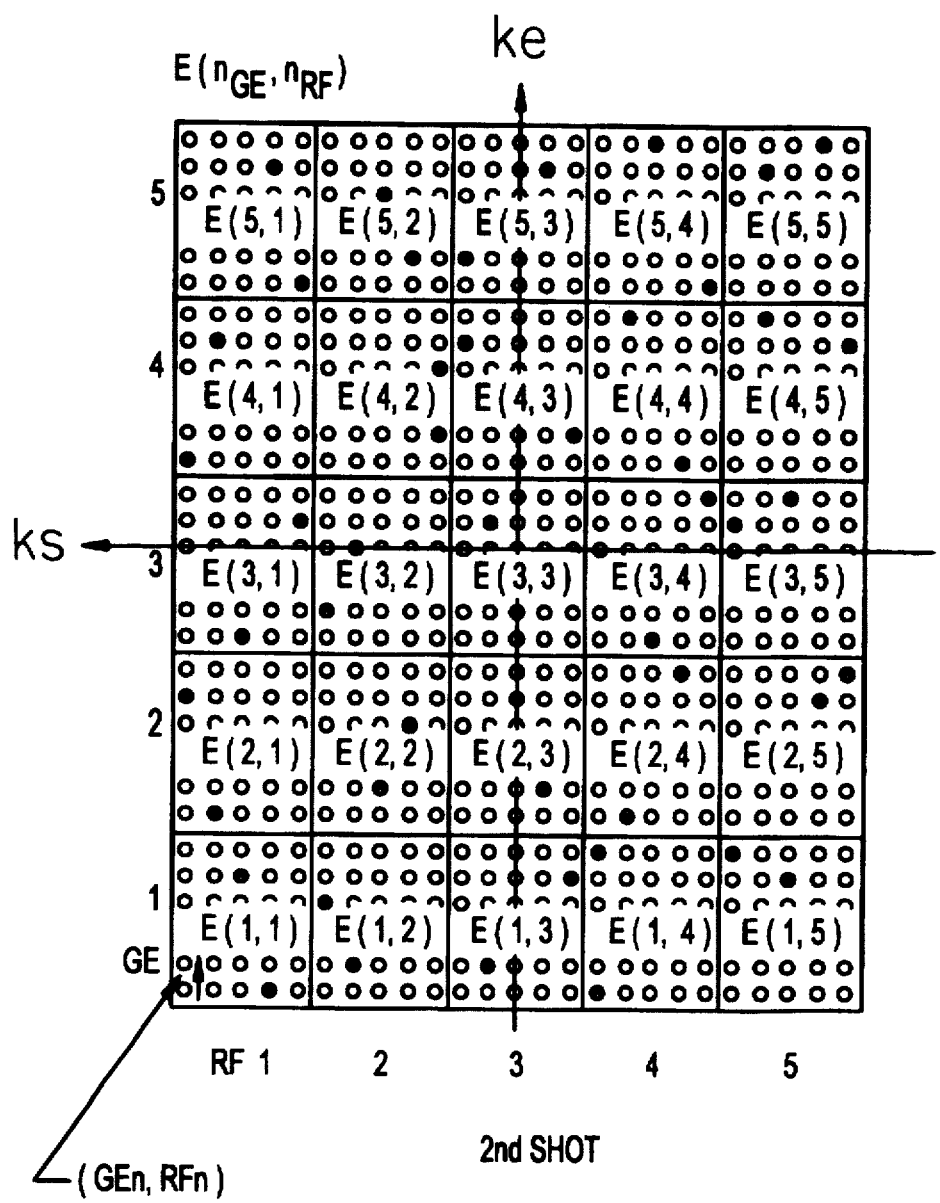
FIG. 21B schematically shows the order of mapping data onto the ke-ks section of the three-dimensional k-space during the second shot in the fourth variant.
Figure 22:
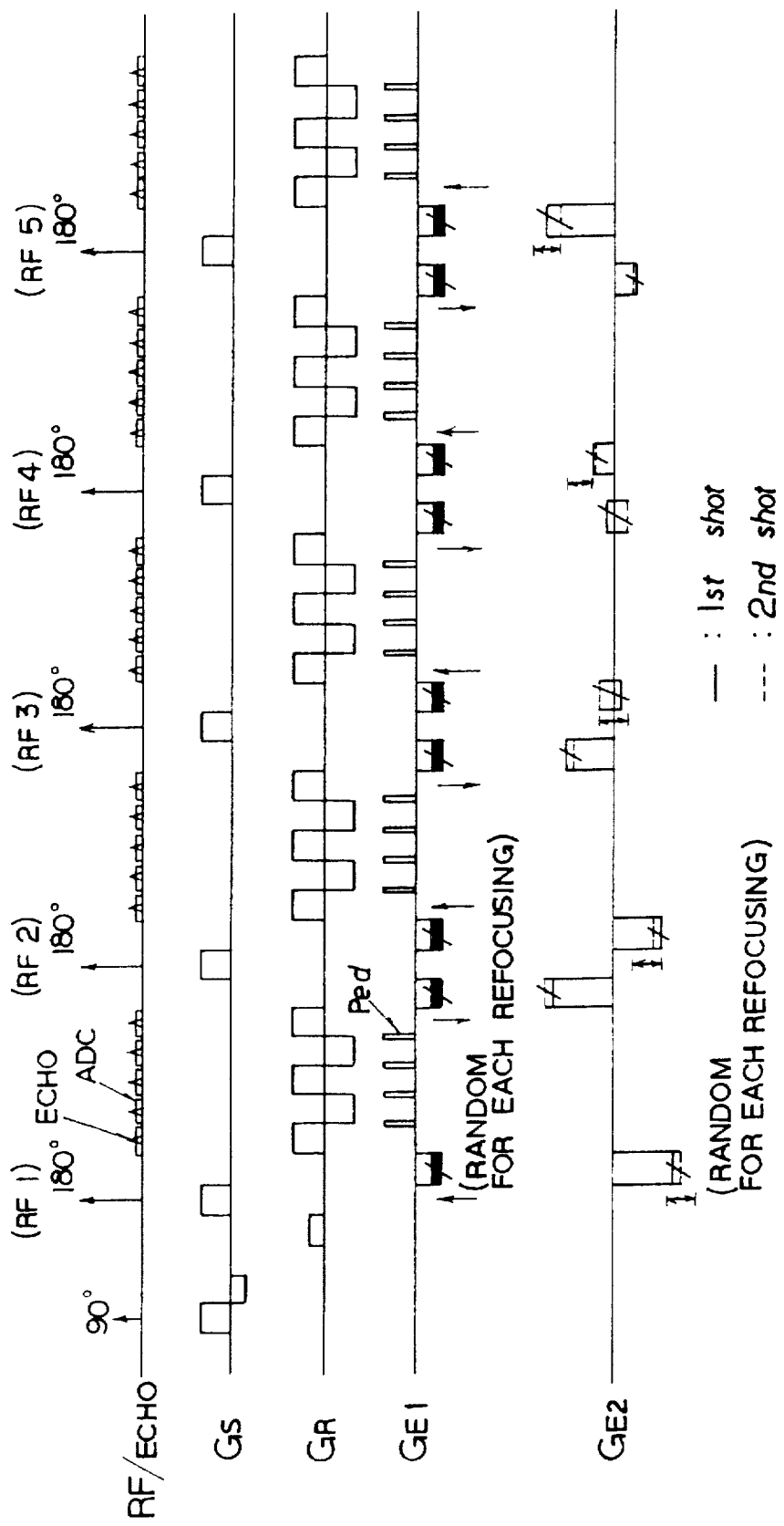
FIG. 22 shows a pulse sequence provided by hybrid EVI in the fourth variant.

The fourth variant relates to the order of mapping data. FIGS. 21A and 21B show an example of an order of mapping data. As illustrated, acquisition locations in mapping blocks (GEn, RFn) associated with echoes E($n_{GE}$ and $n_{RF}$) are determined independently for each mapping block. The mapping order of echo data that traces the locations in the mapping blocks is determined by referring to a table of random numbers. For example, FIG. 21A shows the mapping order of echo data for the first shot. Black dots represent locations into which acquired echo data is mapped. FIG. 21B shows the mapping order of echo data for the second shot. Cross-hatched dots represent locations into which echo data acquired during the second shot is mapped. FIG. 22 represents a partial pulse sequence (only for the first and second shots), which is also carried out by the sequencer 5. In the figure, slant lines on pulses $G_{E1}$ (for base gradient pulse) and $G_{E2}$ depict random application of the pulses $G_{E1}$ and $G_{E2}$ at every refocusing. The mapping order is random, but is predetermined such that it completely fills all the locations in each of the mapping blocks. Since the mapping order of echo data for each refocusing are positive-randomly different from one another, motion artifacts are not manifested as apparent ringing. This leads to further improvement in image quality.

Although such random mapping technique has been carried out for both the phase-encoding gradient pulse $G_{E1}$ and slice-encoding gradient pulse $G_{E2}$, the fourth variant can adopt the random mapping technique for either one of the phase-encoding gradient pulse $G_{E1}$ or the slice-encoding pulse $G_{E2}$.

For realizing the aforesaid first to fourth variants, the other components are identical or similar to those in the first embodiment.

The present invention is not limited to the configuration described in conjunction with the embodiment or variants but may be modified in various modes. Formation of a three-dimensional image has been described so far. Four- or higher-dimensional imaging can also be achieved, wherein the distribution of frequencies or static magnetic field intensities may be included as another dimension.

In FIGS. 10, 16, 18, 20 and 22, the RF excitation pulse provides a flip angle of 90° and the 180° RF refocusing pulse provides a flip angle of 180°. The flip angles are not fixed but may be variable.

The present invention can apply, similarly to the prior art, to multi-slab or multi-angle imaging or bar-shaped region imaging in which a selective excitation magnetic field gradient is imposed as an RF excitation pulse in the direction of phase encoding in order to image.

As described so far, according to one aspect of the present invention, the direction of mapping echo data acquired with the reversal of the polarity of a pulse of readout magnetic field gradient corresponds to a different dimension from the direction of mapping echo data acquired with the application of each of 180° RF refocusing pulses. The periodicity in signal strength of echo data to be mapped in the direction of phase encoding is substantially eliminated. That is to say, if echo data mapped into a three-dimensional k-space is cut out along an arbitrary plane, echo data is always arranged in the order in which the TE value increases. The GRASE-specific periodicity in signal strength that is typical of the prior art can therefore be resolved substantially. Ringing artifacts in images can be suppressed without any degradation in an imaging matrix size, spatial resolution, and image contrast. High-quality images can be produced shortly.

What is claimed is:

1. A method of acquiring echo data in magnetic resonance imaging, said echo data being reconstructed into a more than two dimensional MR image and said magnetic resonance imaging being carried out based on a pulse sequence applied to an object to which a coordinate system having mutually-orthogonal first, second and third directions is set, said method comprising the steps of:

applying to the object a magnetic RF excitation pulse and a magnetic slice-selective pulse set in the first direction;

after applying the magnetic RF excitation pulse and the magnetic slice-selective pulse, applying a magnetic RF refocusing pulse to the object;

after applying the magnetic RF refocusing pulse, applying to the object:

in the first direction, one of two phase-encoding magnetic gradient pulses being incorporated in the pulse sequence and providing a first encoding value changed according to every application of the magnetic RF excitation pulse, in the second direction, a plurality of readout magnetic gradient pulses whose polarities are alternately inverted at every application, thereby a plurality of echoes are generated consecutively from the object in response to inversion of the polarities of the readout magnetic gradient pulses, and in the third direction, the remaining one of the two phase-encoding magnetic gradient pulses being incorporated in the pulse sequence and providing a second encoding value changed according to every application of the magnetic RF excitation pulse and to every inversion of the polarities of the readout-magnetic gradient pulses; and repeating plural times the applying of the magnetic RF refocusing pulse, the applying of the two phase-encoding magnetic gradient pulses, and the applying of the plurality of readout magnetic gradient pulses, said first encoding value being changed at every application of the magnetic RF excitation pulse and the magnetic RF refocusing pulse.

2. The method according to claim 1, further comprising the step of applying a rewinding magnetic gradient pulse, incorporated in the pulse sequence to cancel the first encoding value, between applying the one of the two phase-encoding magnetic pulses and applying the magnetic RF refocusing pulse.

3. The method according to claim 2, further comprising the step of applying a further rewinding magnetic gradient pulse, incorporated in the pulse sequence, to cancel the second encoding value, between applying the remaining one of the two phase-encoding magnetic pulses and applying the magnetic RF refocusing pulse.

4. The method according to claim 1, wherein said pulse sequence includes a further magnetic slice-selective pulse applied to the object concurrently with every application of the magnetic RF refocusing pulse.

5. The method according to claim 1, wherein said MR image is a three dimensional image reconstructed from a three dimensional frequency space having three dimensions of a phase-encoding direction set along the third direction, a readout direction set along the second direction, and a slice-encoding direction set along the first direction.

6. The method according to claim 5, wherein said one of the two phase-encoding magnetic gradient pulses is applied as a slice-encoding magnetic gradient pulse in the slice-encoding direction and said remaining one of the two phase-encoding magnetic gradient pulses is applied as a phase-encoding magnetic gradient pulse in the phase-encoding direction.

7. The method according to claim 6, wherein the pulse sequence consists of a plurality of shots repeated plural times to acquire the echo data of three dimensions, each shot corresponding to respective applications of the magnetic RF excitation pulse.

8. An MRI system in which echo data to reconstruct a more than two dimensional image of an object are acquired based on a pulse sequence applied to the object to which a coordinate system having mutually-orthogonal first, second and third directions is set, said system comprising:

means for applying to the object a magnetic RF excitation pulse and a magnetic slice-selective pulse set in the first direction;

means for applying a plurality of magnetic RF refocusing pulses to the object after applying the magnetic RF excitation pulse and the magnetic slice-selective pulse, a predetermined interval being set after each magnetic RF-refocusing pulse;

means for applying to the object, in the first direction and in each predetermined interval, a first of two phase-encoding magnetic gradient pulses incorporated in the pulse sequence and providing a first encoding value changed according to every application of the magnetic RF excitation pulse and each of the plurality of magnetic RF refocusing pulses;

means for applying to the object in the second direction a plurality of readout magnetic gradient pulses whose polarities are alternately inverted at every application, the readout magnetic gradient pulses being applied after application of the first of the two phase-encoding magnetic gradient pulses in each predetermined interval, thereby generating a plurality of echoes consecutively from the object in response to inversion of the polarities of the readout magnetic gradient pulses; and means for applying to the object in the third direction a second of the two phase-encoding magnetic gradient pulses incorporated in the pulse sequence and providing a second encoding value changed according to every application of the magnetic RF excitation pulse and according to every inversion of the polarities of the readout magnetic gradient pulses.

9. The MRI system according to claim 8, wherein said pulse sequence includes a spoiler pulse applied in the second direction in an interval between application of the magnetic RF excitation pulse and a first magnetic RF refocusing pulse.

10. The MRI system according to claim 8, wherein said magnetic RF excitation pulse has a flip angle of 90° and each of said plurality of magnetic RF refocusing pulses has a flip angle of 180°.

11. The MRI system according to claim 8, wherein said magnetic RF excitation pulse has a flip angle of a specified value other than 90° and each of said plurality of magnetic RF refocusing pulses has a flip angle of a specified value other than 180°.

12. The MRI system according to claim 8, further comprising means for applying a further magnetic slice-selective pulse applied to the object concurrently with each of the plurality of magnetic RF refocusing pulses.

13. The MRI system according to claim 8, wherein said more than two dimensional image is a three dimensional image reconstructed from echo data of a three dimensional frequency space having three dimensions of a phase-encoding direction set along the third direction, a readout direction set along the second direction, and a slice-encoding direction set along the first direction.

14. The MRI system according to claim 13, wherein said means for applying said first of the two phase-encoding magnetic gradient pulses applies said first pulse as a slice-encoding magnetic gradient pulse in the slice-encoding direction, and wherein said means for applying said second of the two phase-encoding magnetic gradient pulses applies said second pulse as a phase-encoding gradient in the phase-encoding direction.

15. The MRI system according to claim 14, further comprising means for providing the pulse sequence as a plurality of shots repeated plural times for acquiring the echo data, each shot corresponding to a respective application of the magnetic RF excitation pulse.

16. The MRI system according to claim 14, further comprising:
means for providing said pulse sequence as two parts performed separately and half by half for the three dimensional frequency space into which the acquired echo data are mapped, said first encoding value provided in the two parts being predetermined in accordance with each position in the slice-encoding direction of the three dimensional frequency space; and
means for storing said pulse sequence.

17. The MRI system according to claim 16, wherein said first encoding value provided by said means for providing said pulse sequence is predetermined such that said echo data having shorter echo times are mapped at higher frequency positions in the slice-encoding direction.

18. The MRI system according to claim 14, further comprising means for providing said pulse sequence including said first encoding value such that said first encoding value is predetermined so as to scroll mapping of echo data in the slice-encoding direction of the three dimensional frequency space.

19. The MRI system according to claim 14, further comprising means for providing said pulse sequence including said first encoding value such that said first encoding value is predetermined in accordance with each position in half of a size in the slice encoding direction of the three dimensional frequency space.

20. The MRI system according to claim 19, further comprising means for calculating complex-conjugate echo data to be mapped into a remaining half of the three dimensional frequency space based on the echo data acquired with the first encoding value.

21. The MRI system according to claim 14, further comprising means for providing said pulse sequence such that at least one of said first encoding value and said second encoding value is changed randomly.

22. The MRI system according to claim 21, wherein said means for applying said phase-encoding gradient pulse provides said phase encoding gradient pulse as a base gradient applied concurrently with the slice-encoding gradient pulse and a plurality of adjusting gradients applied synchronously with each inversion of the polarities of the readout magnetic gradient pulses, said base gradient providing an encoding value being changed at every application of each of the magnetic RF refocusing pulses and each of said adjusting gradients providing a fixed encoding value.

23. The MRI system according to claim 22, further comprising means for randomly changing said encoding value of the base gradient and said first encoding value at every application of each of the RF magnetic refocusing pulses.

24. An MRI system in which echo data to reconstruct a more than two dimensional image of an object are acquired based on a pulse sequence applied to the object to which a coordinate system having mutually-orthogonal first, second and third directions is set, said system comprising:
a magnet for generating a static magnetic field in which the object is placed;
a gradient coil for generating magnetic gradient fields applied to the object, said magnetic gradient fields being incorporated in the pulse sequence and including a magnetic slice-selective pulse set in the first direction, two phase-encoding magnetic gradient pulses, and a readout magnetic gradient pulse set in the second direction, one of the two phase-encoding magnetic gradient pulses being set in the first direction and the remaining one of the two phase-encoding magnetic gradient pulses being set in the third direction;
an RF coil for generating RF fields transmitted to the object and for receiving an echo signal from the object, said echo signal being processed into echo data and said RF fields including a magnetic RF excitation pulse and a plurality of magnetic RF refocusing pulses; and
a sequencer controlling the gradient coil and the RF coil for producing the functions of:
generating the magnetic RF excitation pulse and the magnetic slice-selective pulse,
generating the plurality of magnetic RF refocusing pulses after generation of the magnetic RF excitation and magnetic slice-selective pulses, a predetermined interval being set after each magnetic RF refocusing pulse,
generating in each interval a first of the two phase-encoding magnetic gradient pulses, the first pulse providing a first encoding value changed according to every application of the magnetic RF excitation pulse and each of the plurality of magnetic RF refocusing pulses,
generating plural times the readout magnetic gradient pulse to form a series of adjacent readout gradients whose polarities are alternately inverted, said series of adjacent readout gradients being formed after application of the first of the two phase-encoding magnetic gradient pulses in each interval, the echo signals being thereby generated consecutively from the object in response to inversion of the polarities of the series of adjacent readout gradients, and generating a second of the two phase-encoding magnetic gradient pulses, the second pulse providing a second encoding value changed according to every application of the magnetic RF excitation pulse and according to every inversion of the polarities of the series of adjacent readout gradients.

25. The MRI system according to claim 24, wherein said sequencer further controls said gradient coil and RF coil to produce the function of generating a further magnetic slice-selective pulse synchronously with each of the plurality of magnetic RF refocusing pulses.

26. The MRI system according to claim 24, further comprising means for reconstructing a three dimensional image as said more than two dimensional image, the three dimensional image being reconstructed from a three dimensional frequency space having three dimensions of a phase-encoding direction set along the third direction, a readout direction set along the second direction, and a slice-encoding direction set along the first direction.

27. The MRI system according to claim 26, wherein said sequencer further controls the gradient coil and the RF coil to produce the functions of generating a slice-encoding magnetic gradient pulse in the slice-encoding direction as said first of the two phase-encoding magnetic gradient pulses and generating a phase-encoding magnetic gradient pulse in the phase-encoding direction as said second of the two phase-encoding magnetic gradient pulses.

28. The MRI system according to claim 27, wherein said sequencer provides the additional function of determining said first encoding value in accordance with each position in half of a size in the slice encoding direction of the three dimensional frequency space.

29. The MRI system according to claim 28, further comprising a calculation unit for calculating complex-conjugate echo data to be mapped into a remaining half of the three dimensional frequency space based on the echo data acquired with the first encoding value.

* * * * *